(12) United States Patent
Lee et al.

(10) Patent No.: US 12,610,726 B2
(45) Date of Patent: Apr. 21, 2026

(54) DISPLAY DEVICE AND METHOD FOR MANUFACTURING THE SAME

(71) Applicant: SAMSUNG DISPLAY CO., LTD., Yongin-si (KR)

(72) Inventors: Kang Young Lee, Yongin-si (KR); Tae Jin Kong, Yongin-si (KR); Sung Kook Park, Yongin-si (KR); Ock Soo Son, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 591 days.

(21) Appl. No.: 17/910,481

(22) PCT Filed: May 19, 2020

(86) PCT No.: PCT/KR2020/006546
§ 371 (c)(1),
(2) Date: Sep. 9, 2022

(87) PCT Pub. No.: WO2021/182679
PCT Pub. Date: Sep. 16, 2021

(65) Prior Publication Data
US 2023/0165054 A1 May 25, 2023

(30) Foreign Application Priority Data

Mar. 11, 2020 (KR) ........................ 10-2020-0030281

(51) Int. Cl.
*H10K 59/121* (2023.01)
*H10K 59/12* (2023.01)
(Continued)

(52) U.S. Cl.
CPC ......... *H10K 59/88* (2023.02); *H10K 59/1201* (2023.02); *H10K 59/1213* (2023.02);
(Continued)

(58) Field of Classification Search
CPC ....... H10K 59/88; H10K 71/851; H10K 59/70
See application file for complete search history.

(56) References Cited

U.S. PATENT DOCUMENTS

| | | | |
|---|---|---|---|
| 8,859,306 B2 | 10/2014 | Seo et al. | |
| 8,872,168 B2 | 10/2014 | Choi et al. | |
| (Continued) | | | |

FOREIGN PATENT DOCUMENTS

| | | |
|---|---|---|
| CN | 103594483 A | 2/2014 |
| CN | 107871766 A | 4/2018 |
| (Continued) | | |

OTHER PUBLICATIONS

Written Opinion of the International Searching Authority, International Searching Authority, International application No. PCT/KR2020/006546, Dec. 4, 2020, all pages. (Year: 2020).*

(Continued)

*Primary Examiner* — Victoria K. Hall
(74) *Attorney, Agent, or Firm* — Womble Bond Dickinson (US) LLP

(57) ABSTRACT

A display device includes a substrate including a display area and a non-display area; a pixel circuit layer disposed on a first surface of the substrate and including at least one transistor; a display element layer disposed on the pixel circuit layer and including a light emitting element; a thin film encapsulation layer disposed on the display element layer; and a dummy unit disposed in the non-display area and disposed on an edge portion of the substrate. The dummy unit includes a transparent conductive material.

24 Claims, 28 Drawing Sheets

(51) Int. Cl.

| | |
|---|---|
| *H10K 59/40* | (2023.01) |
| *H10K 59/80* | (2023.01) |
| *H10K 59/88* | (2023.01) |
| *H10K 71/00* | (2023.01) |
| *H10K 71/80* | (2023.01) |

(52) U.S. Cl.
CPC .......... *H10K 59/40* (2023.02); *H10K 59/873* (2023.02); *H10K 59/877* (2023.02); *H10K 71/851* (2023.02); *H10K 59/8731* (2023.02); *H10K 59/8792* (2023.02); *H10K 71/80* (2023.02)

(56) References Cited

U.S. PATENT DOCUMENTS

| | | | |
|---|---|---|---|
| 8,872,214 | B2 | 10/2014 | Negishi et al. |
| 9,166,201 | B2 | 10/2015 | Jeong et al. |
| 9,174,307 | B2 | 11/2015 | Lee et al. |
| 9,229,236 | B2 | 1/2016 | Hino et al. |
| 9,276,047 | B2 | 3/2016 | Ko et al. |
| 9,287,242 | B2 | 3/2016 | Shibata et al. |
| 9,570,425 | B2 | 2/2017 | Do |
| 9,773,761 | B2 | 9/2017 | Do |
| 10,197,873 | B2 | 2/2019 | Shim et al. |
| 10,403,193 | B2 | 9/2019 | Kim et al. |
| 10,446,793 | B2 | 10/2019 | Kim et al. |
| 10,454,048 | B2 | 10/2019 | Jeong |
| 10,629,665 | B2 | 4/2020 | Son et al. |
| 10,651,263 | B2 | 5/2020 | Bae et al. |
| 10,665,661 | B2 | 5/2020 | Park et al. |
| 10,782,813 | B2 | 9/2020 | Lee et al. |
| 2011/0089850 | A1 | 4/2011 | Shibata et al. |
| 2012/0139848 | A1 | 6/2012 | Lee et al. |
| 2015/0050758 | A1* | 2/2015 | Ko ......................... H10K 59/88 438/23 |
| 2015/0072449 | A1* | 3/2015 | Jeong ..................... B32B 38/10 438/23 |
| 2016/0293884 | A1* | 10/2016 | Zhang .................. G09G 3/3208 |
| 2017/0179092 | A1* | 6/2017 | Sasaki .................... H10K 59/70 |
| 2017/0221970 | A1* | 8/2017 | Lee ......................... G06F 3/041 |
| 2018/0061921 | A1* | 3/2018 | Son ...................... G09G 3/3225 |
| 2018/0102502 | A1* | 4/2018 | Kim ...................... H10K 71/70 |
| 2018/0157132 | A1* | 6/2018 | Shim ................... G02F 1/13394 |
| 2018/0190734 | A1 | 7/2018 | Kang et al. |
| 2020/0013831 | A1 | 1/2020 | Zeng et al. |
| 2021/0055818 | A1* | 2/2021 | Won ...................... H10D 86/80 |

FOREIGN PATENT DOCUMENTS

| | | |
|---|---|---|
| KR | 10-1065318 | 9/2011 |
| KR | 4814394 | 11/2011 |
| KR | 10-1094284 | 12/2011 |
| KR | 4914929 | 4/2012 |
| KR | 10-2014-0085331 | 7/2014 |
| KR | 10-1436123 | 11/2014 |
| KR | 10-2015-0020446 | 2/2015 |
| KR | 10-1490758 | 2/2015 |
| KR | 10-2015-0029156 | 3/2015 |
| KR | 10-1793073 | 11/2017 |
| KR | 10-2018-0025052 | 3/2018 |
| KR | 10-2018-0025427 | 3/2018 |
| KR | 10-2018-0031846 | 3/2018 |
| KR | 10-2018-0039801 | 4/2018 |
| KR | 10-2018-0065062 | 6/2018 |
| KR | 10-2019-0042788 | 4/2019 |
| KR | 10-2019-0135586 | 12/2019 |

OTHER PUBLICATIONS

International Search Report, International Searching Authority, International application No. PCT/KR2020/006546, Dec. 4, 2020, all pages. (Year: 2020).*

Written Opinion, Korean Intellectual Property Office, Application No. KR 10-2020-0030281, dated May 19, 2025. (Year: 2025).*

Korean Intellectual Property Office, Written Decision on Registration, Application No. 10-2020-0030281, Oct. 21, 2025, all pages. (Year: 2025).*

State Intellectual Property Office of the People's Republic of China, First Search, Chinese Pat. Application No. 2020800981415, Jan. 19. 2026, all pages. (Year: 2026).*

International Search Report, with English translation, corresponding to International Application No. PCT/KR2020/006546 dated Dec. 4, 2020.

Written Opinion, with English translation, corresponding to International Application No. PCT/KR2020/006546 dated Dec. 4, 2020.

* cited by examiner

DD

DD_DA

DD_NDA

DR3
DR2
DR1

DD

WD

OCA

DMP1

MSUB

DA

NDA

UNT2

VL

II'

II

UNT1

DMP1 ⎤
     ⎬ DMP
DMP2 ⎦

SUB

DA

NDA

VL

II'

II

SUB

DA

NDA

Figure 13:
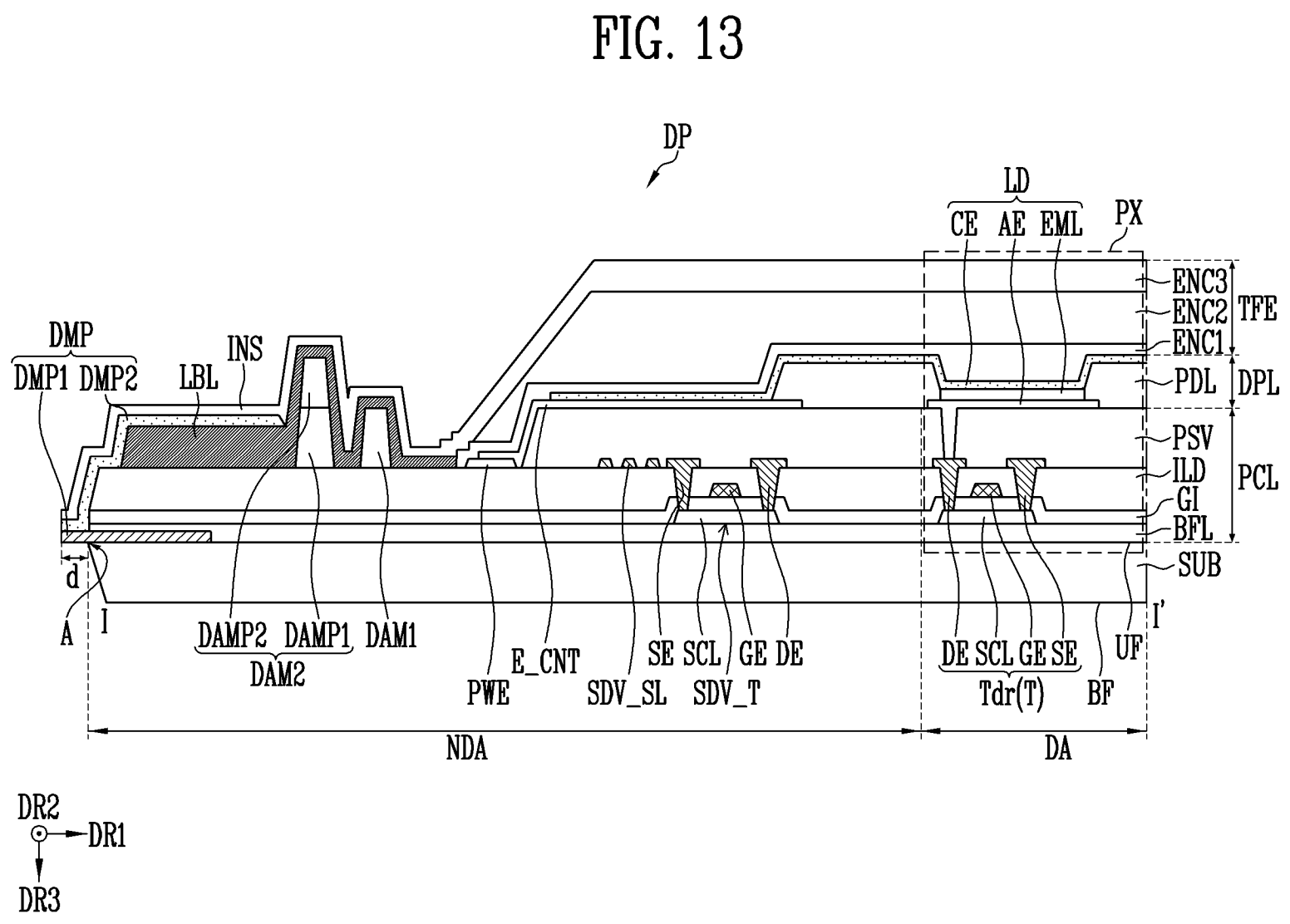

LD { CE AE EML }

TFE { ENC3 ENC2 ENC1 }

DPL { PDL }

PCL { PSV ILD GI BFL SUB }

Tdr(T) { DE SCL GE SE }

UF

BF

DA

SDV_T { SE SCL GE DE }

E_CNT

SDV_SL

PWE

NDA

DMP { DMP1 DMP2 }

INS

LBL

DAM2

DAMP2 DAMP1 DAM1 d

DISPLAY DEVICE AND METHOD FOR MANUFACTURING THE SAME

CROSS-REFERENCE TO RELATED APPLICATION(S)

This application is a national entry of International Application No. PCT/KR2020/006546, filed on May 19, 2020, which claims under 35 U.S.C. §§ 119(a) and 365(b) priority to and benefits of Korean Patent Application No. 10-2020-0030281, filed on Mar. 11, 2020, in the Korean Intellectual Property Office (KIPO), the entire contents of which are incorporated herein by reference.

BACKGROUND

1. Technical Field

Embodiments relate to a display device and a method of manufacturing the display device.

2. Description of the Related Art

As interest in displaying information increases and the demand to use portable devices capable of displaying information and media increases, the demand and commercialization for display devices increase. Such display devices may use a substrate including a resin such as polyimide, and thus may implement display devices that are bendable or foldable.

Recently, in order to provide a wider display screen for a display device without increasing the size of the display device, the development for a display device having a zero bezel (e.g., a minimization of a bezel or almost no bezel) has progressed.

SUMMARY

Embodiments provide a display device having improved reliability by disposing a dummy pattern (or a dummy part) in an outer area of a mother substrate (or a mother glass) of the display device. For example, the dummy pattern of the display device may minimize a defect occurring during a dry etching process for forming (or for cutting) the mother substrate including a pixel unit (or a display unit) in a cell unit (or a display panel unit).

Embodiments also provide a display device having a minimized dead space.

Embodiments also provide a method of manufacturing a display device including a dummy pattern (or a dummy part) in an outer area of a mother substrate and/or having a minimized dead space.

According to an embodiment, a display device may include a substrate including a display area and a non-display area; a pixel circuit layer disposed on a first surface of the substrate and including at least one transistor; a display element layer disposed on the pixel circuit layer and including a light emitting element; a thin film encapsulation layer disposed on the display element layer; and a dummy unit disposed in the non-display area and disposed on an edge portion of the substrate. Here, the dummy unit may include a transparent conductive material.

In an embodiment, the dummy part may include a first dummy part disposed on the first surface of the substrate; and a second dummy part disposed on the first dummy part.

In an embodiment, the first dummy part may be an etch stopper.

In an embodiment, the pixel circuit layer may include a buffer layer disposed on the substrate, at least one insulating layer disposed on the buffer layer, and the at least one transistor disposed on the buffer layer. Here, the second dummy part may cover the buffer layer or the insulating layer.

In an embodiment, wherein the first dummy part and the second dummy part may overlap each other in a plan view.

In an embodiment, the first dummy part and the second dummy part may extend along the edge portion of the substrate.

In an embodiment, the second dummy part may be closer to the display area from the edge portion of the substrate than the first dummy part.

In an embodiment, the first dummy part and the second dummy part may be a substantially same width.

In an embodiment, the display device may further include at least one dam unit disposed in the non-display area of the substrate. The first dummy part and the second dummy part may be positioned between the at least one dam unit at the edge portion of the substrate.

In an embodiment, the display device may further include a light blocking layer disposed between the first dummy part and the second dummy part in the non-display area.

In an embodiment, the light blocking layer may cover the at least one dam unit.

In an embodiment, the display device may further include an auxiliary layer disposed between the light blocking layer and the second dummy part.

In an embodiment, the second dummy part may cover the auxiliary layer.

In an embodiment, the auxiliary layer may be a light diffusion layer including a scattering particle.

In an embodiment, the thin film encapsulation layer may include a first encapsulation layer disposed on the display element layer; a second encapsulation layer disposed on the first encapsulation layer; a third encapsulation layer disposed on the second encapsulation layer. Here, the second encapsulation layer may be an organic insulating layer, and the first and third encapsulation layers may be inorganic insulating layers.

In an embodiment, the third encapsulation layer may cover the second dummy part.

In an embodiment, the light emitting element may include a first electrode electrically connected to the at least one transistor; an emission layer disposed on the first electrode; and a second electrode disposed on the emission layer. Here, the second dummy part and the second electrode may be disposed on a same layer and may include a same material.

In an embodiment, the light emitting element may include a first semiconductor layer doped with a first conductive dopant; a second semiconductor layer doped with a second conductive dopant; and an active layer disposed between the first semiconductor layer and the second semiconductor layer.

In an embodiment, the display device may further include a touch sensor disposed on the thin film encapsulation layer. The touch sensor may include a base layer disposed on the display element layer; a first conductive part disposed on the base layer; a first touch insulating layer disposed on the first conductive part; a second conductive part disposed on the first touch insulating layer; a second touch insulating layer disposed on the second conductive part. Here, the base layer may be disposed on the second dummy part to cover the second dummy part.

In an embodiment, the first dummy part and the second dummy part may protrude from the edge portion of the substrate in a direction away from the display element layer.

In an embodiment, the first and second dummy parts may contact each other.

In an embodiment, the substrate may include the first surface on which the dummy unit is disposed and a second surface facing the first surface. Here, a width of the substrate may decrease as being closer to the second surface from the first surface.

The above-described display device may be formed by preparing a substrate having at least two or more unit areas; forming a first dummy part at an edge of the unit areas; forming a pixel unit in each of the unit areas and forming a second dummy part overlapping the first dummy part; forming a thin film encapsulation layer on the pixel unit and the second dummy part; and removing a portion of the substrate by performing a dry etching process to form a display panel unit.

In an embodiment, the first and second dummy parts may overlap each other and include a transparent conductive oxide.

According to an embodiment, a display device having improved reliability may be formed by protecting configurations disposed on a mother substrate (or a mother glass) from an etching gas used in a process of providing the mother substrate (or the mother glass) as one cell (or display panel) unit by disposing a dummy part in an outer area of the substrate.

According to an embodiment, a display device in which a dead space of the outer area (or a non-display area) of the display panel is minimized may be formed by using a dry etching method in case that the substrate (or the mother glass) is disposed in one cell (or display panel) unit.

According to an embodiment, a method of manufacturing the above-described display device may be provided.

However, embodiments of the disclosure are not limited to those set forth herein. The above and other embodiments will become more apparent to one of ordinary skill in the art to which the disclosure pertains by referencing the detailed description of the disclosure given below.

BRIEF DESCRIPTION OF DRAWINGS

FIGS. 7 to 9 are schematic cross-sectional views taken along line I-I' of FIG. 4, which illustrates the other examples of the display panel shown in FIG. 6.

FIGS. 10A to 10D are schematic plan views sequentially illustrating a method of manufacturing a display device according to an embodiment.

FIG. 11A is a schematic cross-sectional view taken along line II-II' of FIG. 10A.

FIG. 13 is a schematic cross-sectional view taken along line I-I' of FIG. 4, which illustrates another example of the display panel shown in FIG. 12.

FIG. 15 is a schematic cross-sectional view taken along line III-III' of FIG. 14.

FIG. 21 is a schematic cross-sectional view taken along line IV-IV' of FIG. 18, which illustrates another example of the display device shown in FIG. 20.

FIG. 22 is a schematic cross-sectional view taken along line IV-IV' of FIG. 18, which illustrates a second dummy pattern and an insulating layer of FIG. 21 according to an embodiment.

DETAILED DESCRIPTION OF THE EMBODIMENTS

Figure 1:
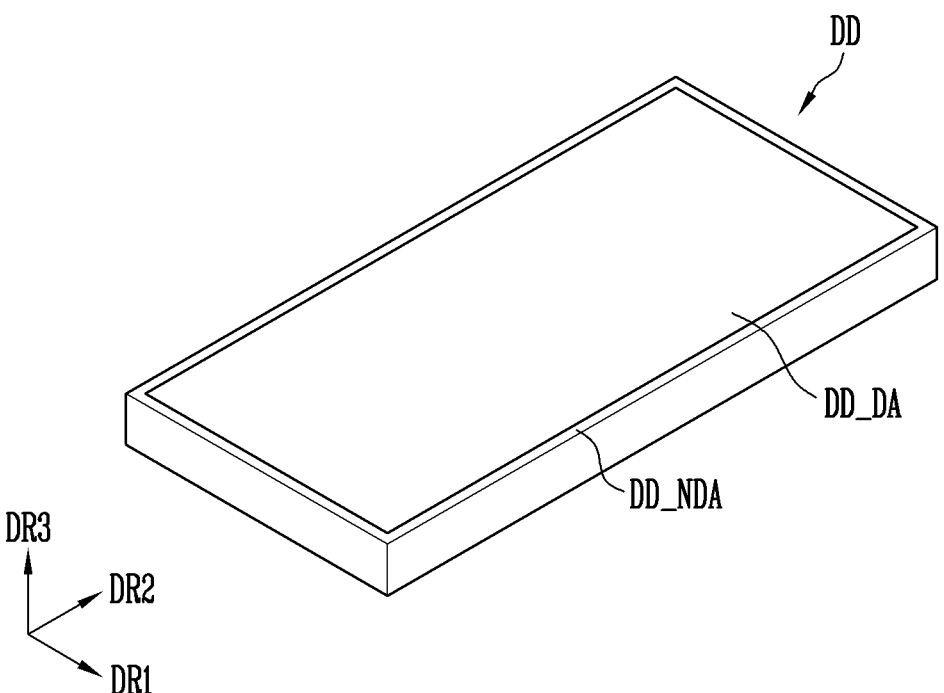
FIG. 1 is a schematic perspective view schematically illustrating a display device according to an embodiment.

Since the disclosure may be modified in various manners and have various forms, specific embodiments will be illustrated in the drawings and will be described in detail in the specification. However, it should be understood that the disclosure is not intended to be limited to the described specific forms, and the disclosure includes all modifications, equivalents, and substitutions within the spirit and technical scope of the disclosure.

Similar reference numerals are used for similar components in describing each drawing. In the accompanying drawings, the dimensions of the structures are shown enlarged from the actual dimensions for the sake of clarity of the disclosure. Terms of "first", "second", and the like may be used to describe various components, but the components should not be limited by the terms. The terms are used only for the purpose of distinguishing one component from another component. For example, without departing from the scope of the disclosure, a first component may be referred to as a second component, and similarly, a second component may also be referred to as a first component. The singular expressions include plural expressions unless the context clearly indicates otherwise.

It should be understood that in the disclosure, a term of "include", "have", or the like is used to specify that there is a feature, a number, a step, an operation, a component, a part, or a combination thereof described in the specification, but does not exclude a possibility of the presence or addition of one or more other features, numbers, steps, operations, components, parts, or combinations thereof in advance. In addition, a case where a portion of a layer, a film, an area, a plate, or the like is referred to as being "on" another portion, it includes not only a case where the portion is "directly on" another portion, but also a case where there is further another portion between the portion and another portion. In addition, in the disclosure, in case that a portion of a layer, a film, an area, a plate, or the like is formed on another portion, a forming direction is not limited to an upper direction but includes forming the portion on a side surface or in a lower direction. On the contrary, in case that a portion of a layer, a film, an area, a plate, or the like is formed "under" another portion, this includes not only a case where the portion is "directly beneath" another portion but also a case where there is further another portion between the portion and another portion.

In the disclosure, in a case where "a component (for example, 'a first component') is operatively or communicatively coupled with/to or "connected to" another component (for example, 'a second component'), the case should be understood that the component may be directly connected to the other component, or may be connected to the other component through another component (for example, a 'third component'). In contrast, in a case where a component (for example, 'a first component') is "directly coupled with/to or "directly connected" to another component (for example, 'a second component'), the case may be understood that another component (for example, 'a third component') is not present between the component and the other component. To this end, the term "connected" may refer to physical, electrical, and/or fluid connection, with or without intervening elements.

Hereinafter, embodiments of the disclosure and other matters necessary for those skilled in the art to readily understand the contents of the disclosure will be described in detail with reference to the accompanying drawings. In the description below, the singular expressions include plural expressions unless the context clearly indicates otherwise.

Figure 2:
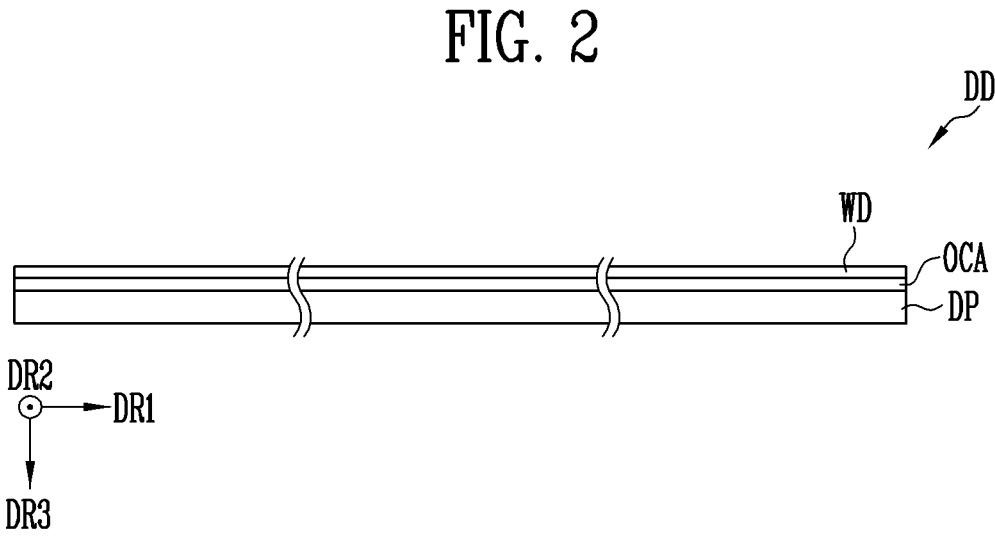
FIG. 2 is a schematic cross-sectional view of the display device of FIG. 1.
Figure 3:
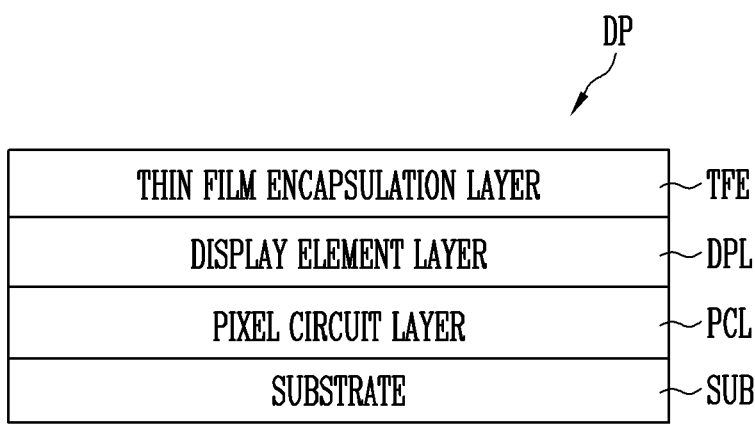
FIG. 3 is a schematic cross-sectional view of a display panel of FIG. 2.

FIG. 1 is a schematic perspective view schematically illustrating a display device according to an embodiment, FIG. 2 is a schematic cross-sectional view of the display device of FIG. 1, and FIG. 3 is a schematic cross-sectional view of a display panel of FIG. 2.

Referring to FIGS. 1 to 3, the display device DD may include a display panel DP and a window WD.

The display device DD may be applied to electronic devices including a display surface, such as a smartphone, a television, a tablet personal computer (PC), a mobile phone, a video phone, an e-book reader, a desktop PC, a laptop PC, a netbook computer, a workstation, a server, a personal digital assistant (PDA), a portable multimedia player (PMP), an MP3 player, a medical device, a camera, or a wearable device.

The display device DD may have various shapes, and for example, the display device DD may have a rectangular plate shape having two pairs of sides parallel to each other, but embodiments are not limited thereto. In case that the display device DD has the rectangular plate shape, one pair of sides of the two pairs of sides may be longer than the other pair of sides. In the drawing, the display device DD has an angled corner portion formed of a straight line, but embodiments are not limited thereto. According to an embodiment, the display device DD having the rectangular plate shape may have a round shape at a corner portion where one long side and one short side contact each other.

In an embodiment, for convenience of description, the display device DD has the rectangular shape having a pair of long sides and a pair of short sides, and an extension direction of the long side is indicated as a second direction DR2, an extension direction of the short side is indicated as a first direction DR1, and a direction perpendicular to the extension directions of the long side and the short side is indicated as a third direction DR3. The first to third directions DR1, DR2, and DR3 may refer to directions indicated by the first to third directions DR1, DR2, and DR3, respectively.

In an embodiment, at least a portion of the display device DD may have flexibility, and the display device DD may be folded at a portion having flexibility.

The display device DD may include a display area DD_DA displaying an image and a non-display area DD_NDA on at least one side of the display area DD_DA. The non-display area DD_NDA is an area in which an image is not displayed. However, embodiments are not limited thereto. According to an embodiment, a shape of the display area DD_DA and a shape of the non-display area DD_NDA may be relatively designed.

According to an embodiment, the display device DD may include a sensing area and a non-sensing area. The display device DD may not only display an image through the sensing area, but also sense a touch input performed on a display surface or sense light incident from a front direction. The non-sensing area may surround the sensing area, but embodiments are not limited thereto. According to an embodiment, a partial area of the display area DA may correspond to (or overlap or face) the sensing area.

The display panel DP may display an image. As the display panel DP, a display panel capable of self-emission, such as an organic light emitting display panel (OLED panel) including an organic light emitting diode as a light emitting element, an ultra-small light emitting diode display panel (e.g., nano-scale LED display panel) including an ultra-small light emitting diode as a light emitting element, and a quantum dot organic light emitting display panel (QD OLED panel) including a quantum dot and an organic light emitting diode, may be used. For example, as the display panel DP, a non-emission display panel, such as a liquid crystal display panel (LCD panel), an electro-phoretic display panel (EPD panel), and an electro-wetting display panel (EWD panel), may be used. In case that the non-emission display panel is used as the display panel DP, the display device DD may include a backlight unit that supplies light to the display panel DP.

The display panel DP may include a substrate SUB, a pixel circuit layer PCL, a display element layer DPL, and a thin film encapsulation layer TFE.

The substrate SUB may be a rigid substrate or a flexible substrate. In case that the substrate SUB is the rigid substrate, the substrate SUB may be one of a glass substrate, a quartz substrate, a glass ceramic substrate, and a crystalline glass substrate. In case that the substrate SUB is the flexible substrate, the substrate SUB may be one of a film substrate and a plastic substrate including a polymer organic material. For example, the substrate SUB may include fiber glass reinforced plastic (FRP).

The pixel circuit layer PCL may be disposed on the substrate SUB. For example, thin film transistors and lines connected to the thin film transistors may be disposed in the pixel circuit layer PCL. For example, each thin film transistor may have a shape in which a semiconductor layer, a gate electrode, and a source/drain electrode are sequentially stacked with an insulating layer interposed (or disposed) therebetween. The semiconductor layer may include amorphous silicon, poly silicon, low temperature poly silicon, and an organic semiconductor. The gate electrode, the source electrode, and the drain electrode may include one of aluminum (Al), copper (Cu), titanium (Ti), and molybdenum (Mo), but embodiments are not limited thereto. For example, the pixel circuit layer PCL may include one or more insulating layers.

The display element layer DPL may be disposed on the pixel circuit layer PCL. The display element layer DPL may include a light emitting element emitting light. The light emitting element may be, for example, an organic light emitting diode, but embodiments are not limited thereto. According to an embodiment, the light emitting element may be an inorganic light emitting element including an inorganic light emitting material or a light emitting element (e.g., a quantum dot display element) that emits light by changing a wavelength of light emitted by a quantum dot. The organic light emitting diode may have, for example, a shape in which an anode electrode, a hole transport layer, an organic emission layer, an electron transport layer, and a cathode electrode are sequentially stacked with each other, but embodiments are not limited thereto.

The thin film encapsulation layer TFE may be disposed on the display element layer DPL. The thin film encapsulation layer TFE may be an encapsulation substrate or may have a shape of an encapsulation layer formed as multiple layers. In case that the thin film encapsulation layer TFE has the shape of the encapsulation layer, the thin film encapsulation layer TFE may include an inorganic layer and/or an organic layer. For example, the thin film encapsulation layer TFE may have a shape in which an inorganic layer, an organic layer, and an inorganic layer are sequentially stacked with each other. The thin film encapsulation layer TFE may prevent external air and moisture from penetrating or permeating into the display element layer DPL and the pixel circuit layer PCL.

The window WD for protecting an exposed surface of the display panel DP may be disposed on the display panel DP. The window WD may protect the display panel DP from external impact and may provide an input surface and/or a display surface to a user. The window WD may be coupled to the display panel DP by using an optically transparent viscosity member OCA (or an adhesive layer).

The window WD may have a multilayer structure including a glass substrate, a plastic film, and a plastic substrate. Such a multilayer structure may be formed by a continuous process or an adhesion process by using an adhesive layer. The entire portion or a partial portion of the window WD may have flexibility.

A touch sensor may be disposed between the display panel DP and the window WD. The touch sensor may be directly disposed on a surface on which an image is emitted from the display panel DP to receive a user's touch input. In an embodiment, "directly disposed" may mean being formed by a continuous process, except for attaching by using a separate viscosity layer (or adhesive layer).

Figure 4:
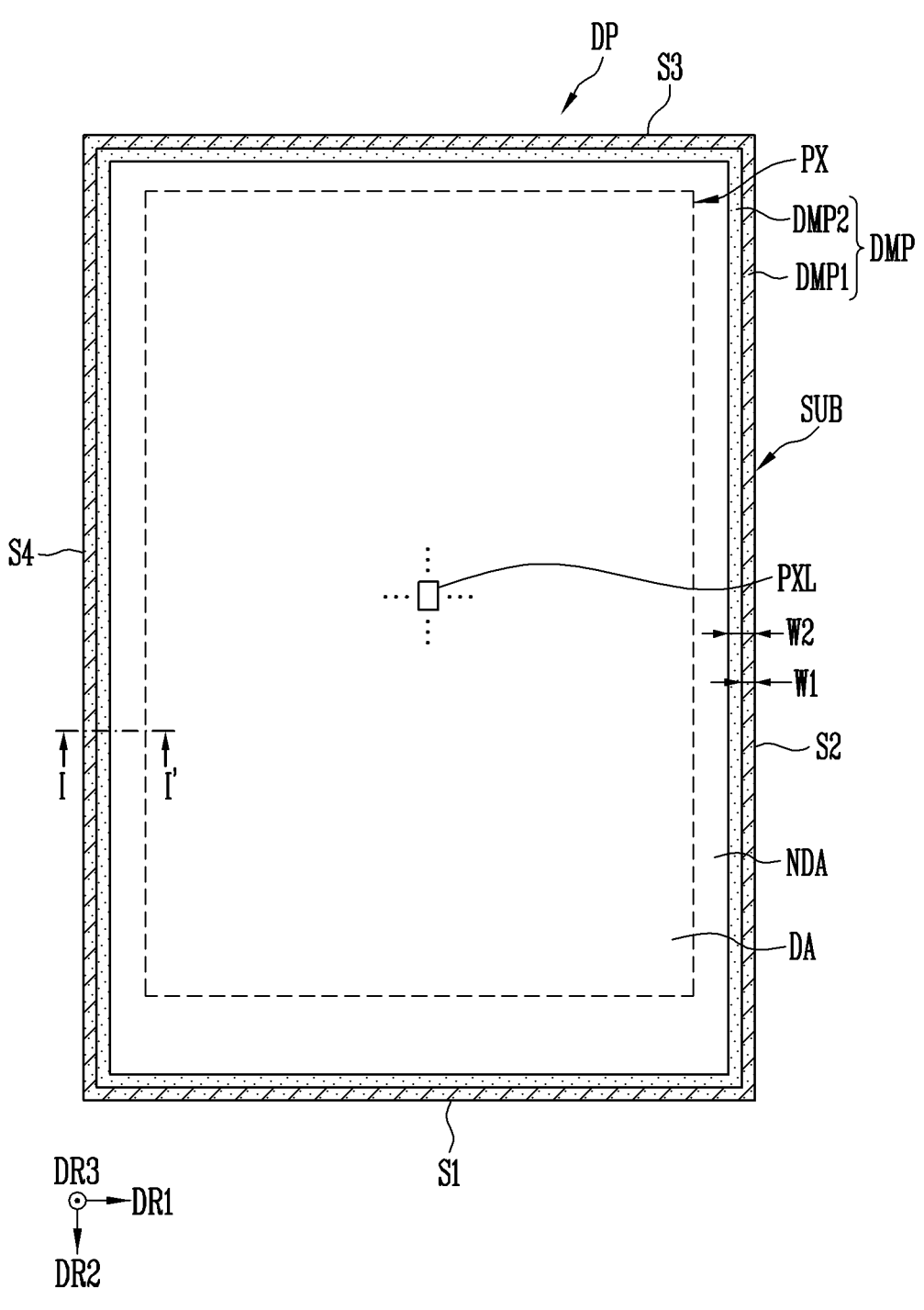
FIG. 4 is a schematic plan view of the display panel of FIG. 2.

FIG. 4 is a schematic plan view of the display panel of FIG. 2.

Referring to FIGS. 1 to 4, the display panel DP may include the substrate SUB, pixels PXL on the substrate SUB, a driver on the substrate SUB and driving the pixels PXL, and a line unit connecting the pixels PXL and the driving unit.

The substrate SUB may include an area having an approximately (or substantially) rectangular shape. However, the size and shape of the substrate SUB may be varied.

The substrate SUB may be formed of an insulating material such as glass or resin. For example, the substrate SUB may be formed of a material having flexibility to be bendable or foldable, and may have a single-layer structure or a multilayer structure. For example, the material having flexibility may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. In an embodiment, the substrate SUB may be formed of polyimide having flexibility. However, the material of the substrate SUB is not limited thereto.

The substrate SUB may include a display area DA and a non-display area NDA. The display area DA may be an area in which the pixels PXL are disposed to display an image, and the non-display area NDA may be an area in which the pixels PXL are not disposed and may be an area in which an image is not displayed. For convenience of description, only one pixel PXL is shown in FIG. 4, but pixels PXL may be disposed in the display area DA of the substrate SUB.

The display area DA of the display panel DP may correspond to (or overlap or face) the display area DD_DA of the display device DD, and the non-display area NDA of the display panel DP may correspond to (or overlap or face) the non-display area DD_NDA of the display device DD.

The driver for driving the pixels PXL and a portion of the line connecting the pixels PXL and the driver may be disposed in the non-display area NDA. The non-display area NDA may correspond to (or overlap or face) a bezel area of the display device DD.

The pixels PXL may be disposed in the display area DA of the substrate SUB. Each of the pixels PXL may be a minimum unit for displaying an image. The pixels PXL may include a light emitting element emitting white light and/or color light. Each of the pixels PXL may emit any one color among red, green, and blue colors, but embodiments are not limited thereto, and may emit cyan light, magenta light, yellow light, or the like. Each of the pixels PXL may include the pixel circuit layer PCL on the substrate SUB and the display element layer DPL on the pixel circuit layer PCL.

The pixels PXL may be arranged in a matrix form along a row extending in the first direction DR1 and a column extending in the second direction DR2 crossing the first direction DR1. However, embodiments are not limited to an arrangement form of the pixels PXL, and the pixels PXL may be arranged in various forms. The pixels PXL have a rectangular shape in the drawing, but embodiments are not limited thereto, and the pixels PXL may be modified into various shapes. For example, in case that pixels PXL are disposed, the pixels PXL may be disposed to have different areas (or sizes). For example, in a case of pixels PXL having different colors of emitted light, the pixels PXL may be disposed in different areas (or sizes) or in different shapes for each color.

The driver may provide a signal to each of the pixels PXL through the line unit and control driving of the pixels PXL. In FIG. 4, the line unit is omitted for convenience of description, and the line unit is described below with reference to FIGS. 5A and 5B.

The driver may include a scan driver that transmits a scan signal to each of the pixels PXL through a scan line, an emission driver that provides an emission control signal to each of the pixels PXL through an emission control line, a data driver that provides a data signal to each of the pixels PXL through a data line, and a timing controller. The timing controller may control the scan driver, the emission driver, and the data driver.

For example, the display panel DP may include a pixel unit PX (or a display unit) and a dummy unit DMP spaced apart from the pixel unit PX (or the display unit).

The pixel unit PX (or the display unit) may include the pixels PXL displaying an image and the thin film encapsulation layer TFE on the pixels PXL. For example, the pixel unit PX (or the display unit) may include the pixels PXL in the display area DA to display an image, and the thin film encapsulation layer TFE on the pixels PXL to cover the pixels PXL.

The dummy unit DMP may be disposed in the non-display area NDA of the substrate SUB. The dummy unit DMP may be spaced apart from the pixel unit PX (or the display unit) at a distance (e.g., a predetermined distance) in a plan view and may be disposed along an edge (or edge portion) of the substrate SUB. In an embodiment, the dummy unit DMP may be disposed along all of first, second, third, and fourth sides S1, S2, S3, and S4 of the substrate SUB, but embodiments are not limited thereto. At least one side of the dummy unit DMP may coincide (e.g., contact or match) with the edge (or edge portion) of the substrate SUB or may protrude from the edge (or edge portion) of the substrate SUB along the first direction DR1 (or a horizontal direction) in a direction away from the pixel unit PX (or the display unit) in a plan view. For example, at least one side of the dummy unit DMP may protrude outward from the edge (or edge portion) of the substrate SUB along the first direction DR1. In FIG. 4, for descriptive convenience, at least one side of the dummy unit DMP is shown to coincide (or contact) with the edge (or edge portion) of the substrate SUB.

In an embodiment, an example in which the dummy unit DMP is disposed along the first to fourth sides S1 to S4 of the substrate SUB to have a shape forming a closed circuit is illustrated, but embodiments are not limited thereto. In case that a shape of the substrate SUB is changed, a provision position and a shape of the dummy unit DMP may be set differently. In case that the substrate SUB is formed in a circle, an ellipse, or a polygon, the dummy unit DMP may be disposed in a shape corresponding to the circle and forming a closed circuit, a shape corresponding to the ellipse and forming a closed circuit, or a shape corresponding to the polygon and forming a closed circuit. For example, the dummy unit DMP may be disposed along the edge portion of the substrate SUB. For example, the dummy unit DMP may partially or entirely surround the edge portion of the substrate SUB.

The dummy unit DMP may include a first dummy pattern DMP1 (e.g., a first dummy part) and a second dummy pattern DMP2 (e.g., a first dummy part). The first dummy pattern DMP1 and the second dummy pattern DMP2 may overlap each other in a horizontal direction (e.g., in the first or second direction DR1 or DR2) and may have the substantially same planar shape or similar planar shape. For example, each of the first and second dummy patterns DMP1 and DMP2 may have a shape forming a closed circuit along the edge portion of the substrate SUB. A detailed description of the dummy unit DMP is described below with reference to FIGS. 6 to 9.

Figure 5A:
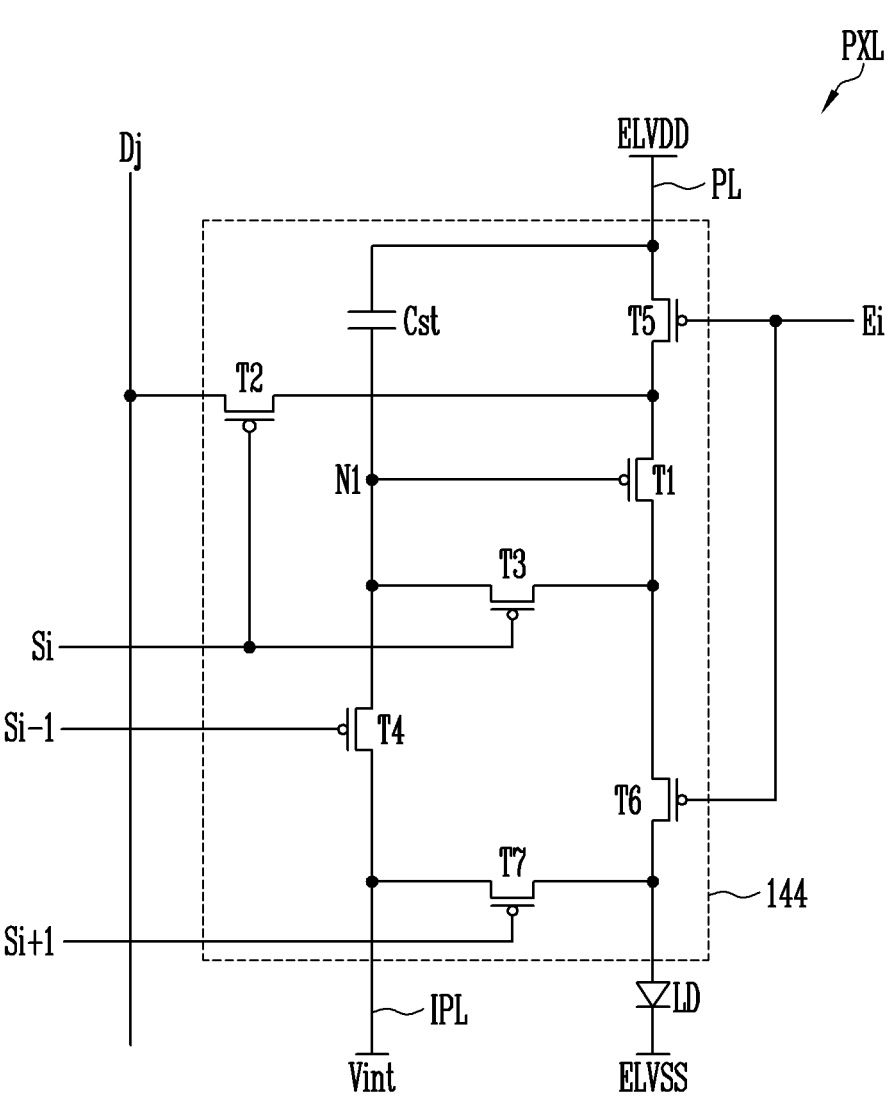
FIGS. 5A and 5B are schematic circuit diagrams illustrating an electrical connection of components included in one pixel shown in FIG. 4 according to an embodiment.
Figure 5B:
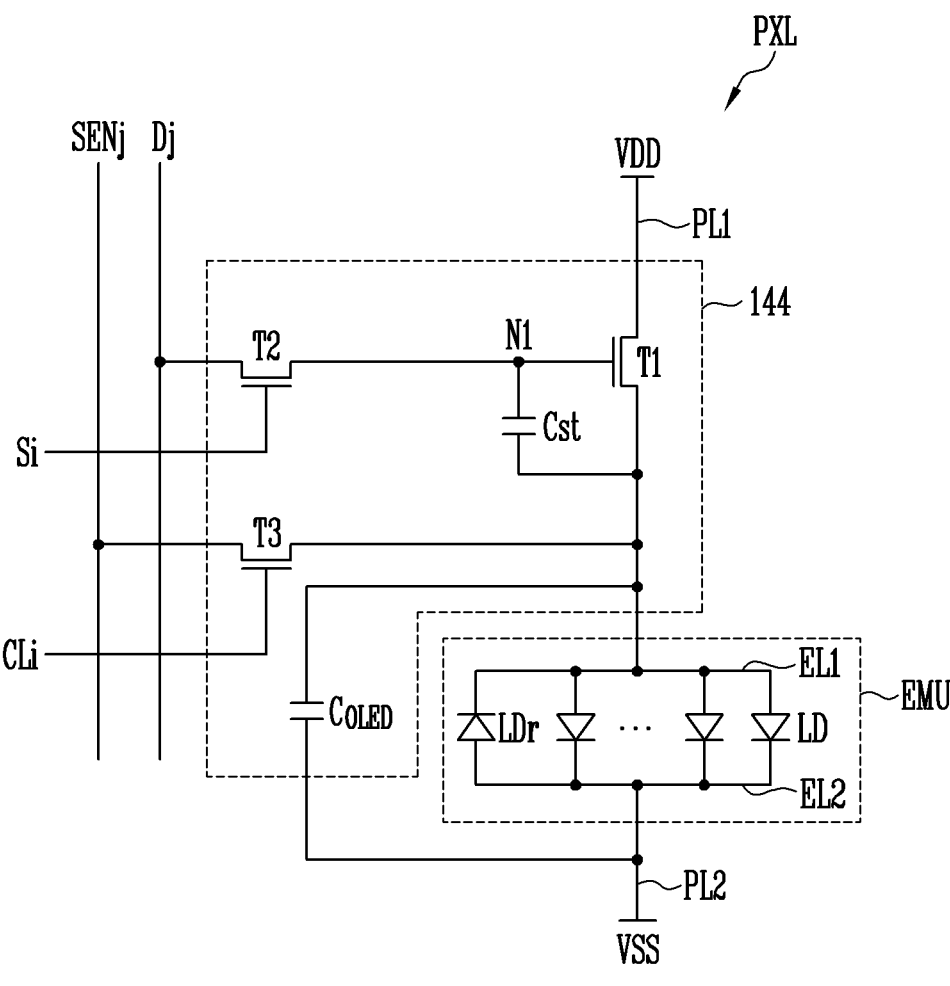

FIGS. 5A and 5B are circuit diagrams illustrating an electrical connection of components included in a representative pixel shown in FIG. 4 according to an embodiment.

In FIGS. 5A and 5B, components included in each of the pixels shown in FIG. 4 and/or an area, in which the components are disposed, are referred to as the pixel PXL. The pixel PXL shown in each of FIGS. 5A and 5B may be any one of the pixels PXL included in the display panel DP of FIG. 4, and the pixels PXL may have structures substantially identical to or similar to each other.

In FIG. 5A, a pixel PXL may include an organic light emitting diode as the light emitting element LD. In FIG. 5B, a pixel PXL may include ultra-small inorganic light emitting diodes as small as a micro-scale or a nano-scale formed in a structure in which a nitride-based semiconductor is grown as the light emitting element LD.

In FIG. 5A, an active-type pixel PXL, which is connected to an i-th scan line Si and an i-th emission control line Ei disposed in an i-th row (or pixel row) of the display area DA of the display panel DP and a j-th data line Dj disposed in a j-th column (or pixel column) and includes seven transistors and a storage capacitor Cst, is shown.

Referring to FIGS. 1 to 5A, each pixel PXL may include the light emitting element LD and a pixel circuit 144 for driving the light emitting element LD. In an embodiment, the light emitting element LD may be an organic light emitting diode, but embodiments are not limited thereto.

The pixel circuit 144 may be connected to a scan line Si and a data line Dj of a corresponding pixel PXL. In case that the pixel PXL is disposed in the i-th (i is a natural number) row and j-th (j is a natural number) column of the display area DA of the display panel DP, the pixel circuit 144 of the pixel PXL may be connected to the i-th scan line Si and the j-th data line Dj of the display area DA. For example, according to an embodiment, the pixel circuit 144 may be further connected to at least another scan line. For example, a pixel PXL disposed in the i-th row of the display area DA of the display panel DP may be further connected to an (i−1)-th scan line Si−1 and/or an (i+1)-th scan line Si+1. For example, according to an embodiment, the pixel circuit 144 may be further connected to third power in addition to first and second pixel powers ELVDD and ELVSS. For example, the pixel circuit 144 may also be connected to initialization power Vint.

The pixel circuit 144 may include first to seventh transistors T1 to T7 and a storage capacitor Cst.

An electrode, for example, a source electrode of the first transistor T1 (e.g., a driving transistor), may be connected to a power line PL to which the first pixel power ELVDD is applied via the fifth transistor T5, and another electrode, for example, a drain electrode may be connected to the light emitting elements LD via the sixth transistor T6. For example, a gate electrode of the first transistor T1 may be connected to a first node N1. The first transistor T1 may control a driving current flowing between the first pixel power ELVDD and the second pixel power ELVSS via the light emitting element LD in response to a voltage of the first node N1.

The second transistor T2 (e.g., a switching transistor) may be connected between the j-th data line Dj connected to the pixel PXL and the source electrode of the first transistor T1. For example, a gate electrode of the second transistor T2 may be connected to the i-th scan line Si connected to the pixel PXL. The second transistor T2 may be turned on in case that a scan signal of a gate-on voltage (for example, a low voltage) is supplied from the i-th scan line Si, to electrically connect the j-th data line Dj to the source electrode of the first transistor T1. Therefore, in case that the second transistor T2 is turned on, the data signal supplied from the j-th data line Dj may be transmitted to the first transistor T1.

The third transistor T3 may be connected between the drain electrode of the first transistor T1 and the first node N1. For example, a gate electrode of the third transistor T3 may be connected to the i-th scan line Si. The gate electrode of the third transistor T3 may be turned on in case that the scan signal of the gate-on voltage is supplied from the i-th scan line Si, to electrically connect the drain electrode of the first transistor T1 and the first node N1 to each other.

The fourth transistor T4 may be connected between the first node N1 and an initialization power line IPL to which the initialization power Vint is applied. For example, a gate electrode of the fourth transistor T4 may be connected to a previous scan line, for example, the (i−1)-th scan line Si−1. The fourth transistor T4 may be turned on in case that the scan signal of the gate-on voltage is supplied to the (i−1)-th scan line Si−1, to transmit a voltage of the initialization power Vint to the first node N1. Here, the initialization power Vint may have a voltage equal to or less than the lowest voltage of the data signal.

The fifth transistor T5 may be connected between the power line PL to which the first pixel power ELVDD is provided and the first transistor T1. For example, a gate electrode of the fifth transistor T5 may be connected to a corresponding emission control line, for example, an i-th emission control line Ei. The fifth transistor T5 may be turned off in case that an emission control signal of a gate-off voltage is supplied to the i-th emission control line Ei, and may be turned on in other cases.

The sixth transistor T6 may be connected between the first transistor T1 and the light emitting element LD. For example, a gate electrode of the sixth transistor T6 may be connected to the i-th emission control line Ei. The sixth transistor T6 may be turned off in case that the emission control signal of the gate-off voltage is supplied to the i-th emission control line Ei, and may be turned on in other cases.

The seventh transistor T7 may be connected between the light emitting element LD and the initialization power line IPL to which the initialization power Vint is applied. For example, a gate electrode of the seventh transistor T7 may be connected to any one of scan lines of a next stage, for example, the (i+1)-th scan line Si+1. The seventh transistor T7 may be turned on in case that the scan signal of the gate-on voltage is supplied to the (i+1)-th scan line Si+1, to supply the voltage of the initialization power Vint to the light emitting element LD. At this time, the signal applied to the gate electrode of the seventh transistor T7 may be a signal of the same timing as the scan signal of the gate-on voltage supplied to the (i+1)-th scan line Si+1. For example, the signal applied to the gate electrode of the seventh transistor T7 and the scan signal of the gate-on voltage supplied to the (i+1)-th scan line Si+1 may be applied at the same timing.

The storage capacitor Cst may be connected between the power line PL, to which the first pixel power ELVDD is applied, and the first node N1. The storage capacitor Cst may store a data signal and a voltage corresponding to a threshold voltage of the first transistor T1.

A first electrode (e.g., an anode electrode) of the light emitting element LD may be connected to the first transistor T1 via the sixth transistor T6, and a second electrode (e.g., a cathode electrode) may be connected to the second pixel power ELVSS. The light emitting element LD generates light (or rays) of a luminance (e.g., a predetermined luminance) in response to a current amount supplied from the first transistor T1. A voltage value of the first pixel power ELVDD may be set higher than a voltage value of the second pixel power ELVSS so that a current may flow through the light emitting element LD.

The light emitting element LD may be, for example, an organic light emitting diode. The light emitting element LD may emit light in one of red, green, and blue. However, embodiments are not limited thereto.

For example, a structure of each pixel PXL is not limited to the embodiment shown in FIG. 5A. For example, it goes without saying that the pixel circuits 144 of various structures may be applied to each pixel PXL.

Hereinafter, each pixel PXL including light emitting elements LD formed in a structure in which a nitride-based semiconductor is grown (or implemented) is described with reference to FIG. 5B.

Referring to FIGS. 1 to 4 and 5B, each pixel PXL may include a light emitting unit EMU that generates light of a luminance corresponding to the data signal. For example, each pixel PXL may (selectively) further include the pixel circuit 144 for driving the light emitting unit EMU.

According to an embodiment, the light emitting unit EMU may include light emitting elements LD connected in parallel between a first power line PL1 to which a voltage of first driving power VDD is applied and a second power line PL2 to which second driving power VSS is applied. For example, the light emitting unit EMU may include a first electrode EL1 (e.g., a first alignment electrode) connected to the first driving power VDD via the pixel circuit 144 and the first power line PL1, a second electrode EL2 (e.g., a second alignment electrode) connected to the second driving power VSS through the second power line PL2, and light emitting elements LD connected in parallel between the first and second electrodes EL1 and EL2. For example, the light emitting elements LD may be arranged in the same direction (for example, a forward-bias direction). In an embodiment, the first electrode EL1 may be an anode electrode, and the second electrode EL2 may be a cathode electrode. A capacitor COLED may be placed across the light emitting elements LD with one end of the capacitor COLED electrically contacting the first electrode EL1 and another end of the capacitor COLED electrically contacting the second electrode EL2.

Each of the light emitting elements LD included in the light emitting unit EMU may include first and second semiconductor layers formed of different types of semiconductor layers, and an active layer interposed therebetween. For example, each of the light emitting elements LD may be implemented as a light emitting stack in which the first semiconductor layer, the active layer, and the second semiconductor layer are sequentially stacked with each other in a direction. Here, the first semiconductor layer may be an n-type semiconductor layer, and the second semiconductor layer may be a p-type semiconductor layer.

Each of the light emitting elements LD may include a first end connected to the first driving power VDD through the first electrode EL1 and a second end connected to the second driving power VSS through the second electrode EL2. The first driving power VDD and the second driving power VSS may have different potentials. For example, the first driving power VDD may be set as high potential power, and the second driving power VSS may be set as low potential power. At this time, a potential difference between the first and second driving power VDD and VSS may be set to be greater than or equal to a threshold voltage of the light emitting elements LD during an emission period of the pixel PXL.

As described above, each light emitting element LD connected in parallel in the same direction (for example, a forward-bias direction) between the first electrode EL1 and the second electrode EL2 to which voltages of different potentials are respectively supplied may operate as each effective light source. Such effective light sources may be combined (or integrated) to form (or implement) the light emitting unit EMU of the pixel PXL. The light emitting elements LD of the light emitting unit EMU may emit light with a luminance corresponding to the driving current supplied through the pixel circuit 144. For example, during each frame period, the pixel circuit 144 may supply a driving current corresponding to a grayscale value of corresponding frame data to the light emitting unit EMU. The driving current supplied to the light emitting unit EMU may be divided and may flow through the light emitting elements LD. Accordingly, the light emitting unit EMU may emit light of a luminance corresponding to the driving current in case that each light emitting element LD emits light with a luminance corresponding to the current flowing therethrough.

According to an embodiment, the light emitting unit EMU may further include at least one ineffective light source in addition to the light emitting elements LD (as each effective light source). For example, at least a reverse light emitting element LDr may be further connected between the first and second electrodes EL1 and EL2 of the light emitting unit EMU. The reverse light emitting element LDr may be connected in parallel between the first and second electrodes EL1 and EL2 together with the light emitting elements LD (as the effective light sources), and may be connected between the first and second electrodes EL1 and EL2 in a direction (e.g., a reverse-bias direction) opposite to (the forward-bias direction of) the light emitting elements LD.

The pixel circuit 144 may be connected to the scan line Si and the data line Dj of the corresponding pixel PXL. For example, in case that the pixel PXL is disposed in the i-th (where i is a natural number) row and the j-th (where j is a natural number) column of the display area DA, the pixel circuit 144 of the pixel PXL may be connected to the i-th scan line Si and the j-th data line Dj of the display area DA. For example, the pixel circuit 144 may be further connected to a control line CLi and a sensing line SENj of the pixel PXL. The pixel circuit 144 may include first to third transistors T1 to T3 and a storage capacitor Cst.

Since a configuration and an operation of the first and second transistors T1 and T2 are similar to those of the first and second transistors T1 described with reference to FIG. 5A except for a connection position change of some components due to a type change of a transistor, a description thereof is omitted for descriptive convenience.

The third transistor T3 may be connected between the first transistor T1 and the sensing line SENj. For example, an electrode of the third transistor T3 may be connected to a terminal (for example, the source electrode) of the first transistor T1 connected to the first electrode EL1, and another electrode of the third transistor T3 may be connected to the sensing line SENj. In case that the sensing line SENj is omitted, a gate electrode of the third transistor T3 may be connected to the j-th data line Dj.

According to an embodiment, the gate electrode of the third transistor T3 may be connected to the control line CLi. In case that the control line CLi is omitted, the gate electrode of the third transistor T3 may be connected to the i-th scan line Si. The third transistor T3 may be turned on by a control signal of a gate-on voltage (for example, a high level) supplied to the control line CLi during a sensing period (e.g., a predetermined sensing period), to electrically connect the sensing line SENj and the first transistor T1 to each other.

According to an embodiment, a sensing period may be a period for extracting characteristic information (for example, the threshold voltage or the like of the first transistor T1) of each of the pixels PXL disposed in the display area DA. During the above-described sensing period, the first transistor T1 may be turned on by supplying a reference voltage (e.g., a predetermined reference voltage) at which the first transistor T1 may be turned on to the first node N1 through the j-th data line Dj and the second transistor T2, or connecting each pixel PXL to a current source or the like. For example, the first transistor T1 may be connected to the sensing line SENj by supplying the control signal of the gate-on voltage to the third transistor T3 to turn on the third transistor T3. Therefore, the characteristic information of each pixel PXL including the threshold voltage or the like of the first transistor T1 may be extracted (or measured) through the above-described sensing line SENj. The extracted (measured) characteristic information may be used to convert image data so that a characteristic deviation between the pixels PXL is compensated.

For example, FIG. 5B discloses an embodiment in which all of the first to third transistors T1 to T3 are N-type transistors, but embodiments are not limited thereto. For example, at least one of the above-described first to third transistors T1 to T3 may be changed to a P-type transistor. For example, FIG. 5B discloses an embodiment in which the light emitting unit EMU is connected between the pixel circuit 144 and the second driving power VSS, but the light emitting unit EMU may also be connected between the first driving power VDD and the pixel circuit 144.

A structure of each pixel PXL is not limited to the embodiments shown in FIGS. 5A and 5B, and the corresponding pixel PXL may have various structures.

Figure 6:
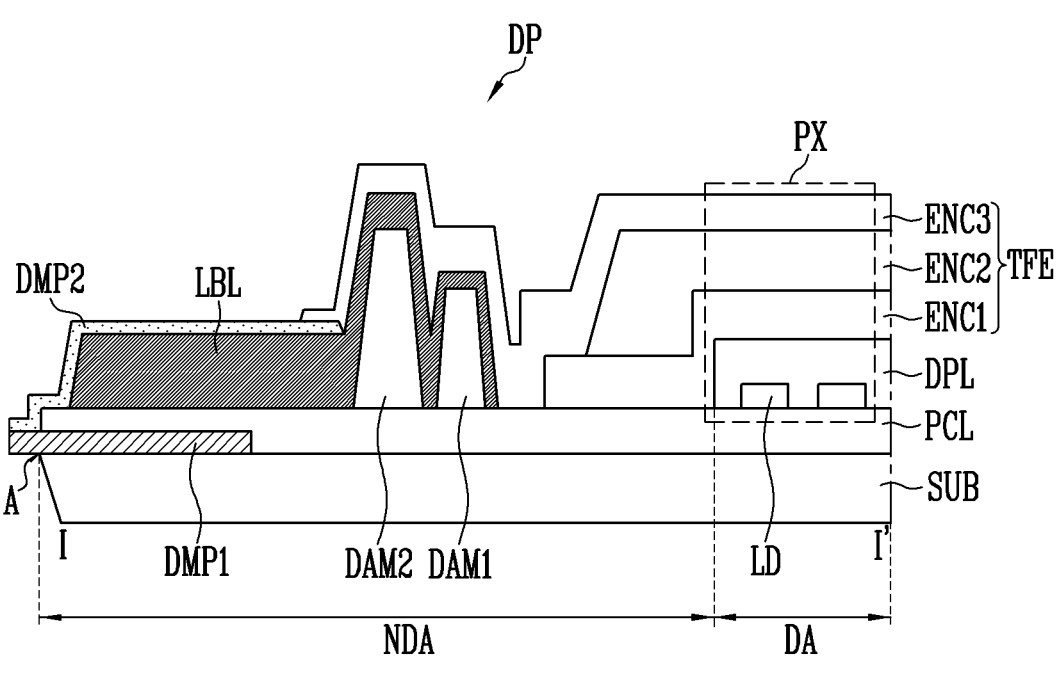
FIG. 6 is a schematic cross-sectional view taken along line I-I' of FIG. 4.
Figure 6:
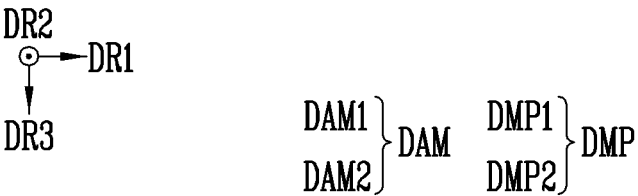

FIG. 6 is a schematic cross-sectional view taken along line I-I' of FIG. 4, and FIGS. 7 to 9 are schematic cross-sectional views taken along line I-I' of FIG. 4, which illustrates the other examples of the display panel shown in FIG. 6.

In FIGS. 6 to 9, a structures of the dummy unit DMP and the pixel unit PX (e.g., the display unit) are simplified, such as showing each electrode as a single electrode layer and each insulating layer as only a single insulating layer, but embodiments are not limited thereto.

In an embodiment, "formed and/or disposed on the same layer" may mean formed in the same process, and "formed and/or disposed on different layers" may mean formed in different processes.

For example, in an embodiment, "connection" between two components may mean that both an electrical connection and a physical connection are used inclusively.

Referring to FIGS. 1 to 9, the display panel DP may include the pixel unit PX or (the display unit) in the display area DA and the dummy unit DMP in the non-display area NDA. For example, the display panel DP may include a dam unit DAM in the non-display area NDA and disposed between the dummy unit DMP and the pixel unit PX (e.g., the display unit).

The pixel unit PX (e.g., the display unit) may include the pixels PXL on the substrate SUB and the thin film encapsulation layer TFE covering the pixels PXL. Each of the pixels PXL may include the pixel circuit layer PCL on the substrate SUB and the display element layer DPL on the pixel circuit layer PCL.

The pixel circuit layer PCL may include a buffer layer BFL, the pixel circuit 144 on the buffer layer BFL, and a protective layer PSV on the pixel circuit 144.

The buffer layer BFL may be disposed and/or formed on a surface UF (or an upper surface) of the substrate SUB. The buffer layer BFL may prevent an impurity from diffusing into a transistor T included in the pixel circuit 144. The buffer layer BFL may be an inorganic insulating layer including an inorganic material. The buffer layer BFL may include at least one of metal oxide such as silicon nitride ($SiN_x$), silicon oxide ($SiO_x$), silicon oxynitride (SiON), and aluminum oxide ($AlO_x$). The buffer layer BFL may be formed as a single layer, or may be formed as multiple layers of at least double layers. In case that the buffer layer BFL is formed as the multiple layers, each layer may be formed of the same material or may be formed of different materials. The buffer layer BFL may be omitted according to a material, a process condition, and the like of the substrate SUB.

The pixel circuit 144 may include at least one transistor T. The transistor T may include a driving transistor Tdr (e.g., the first transistor T1) that controls a driving current of the light emitting element LD and a switching transistor electrically connected to the driving transistor Tdr. However, embodiments are not limited thereto, and the pixel circuit 144 may further include circuit elements performing another function in addition to the driving transistor Tdr and the switching transistor. In the following embodiment, in case that the driving transistor Tdr and the switching transistor are collectively referred to, the driving transistor Tdr and the switching transistor are referred to as a transistor T or transistors T. Here, the driving transistor Tdr may have the same configuration (or structure) as the first transistor T1 described with reference to FIGS. 5A and 5B, and the switching transistor may have the same configuration (or structure) as the second transistor T2 described with reference to FIGS. 5A and 5B. The driving transistor Tdr and the switching transistor may have a structure substantially similar to or identical to each other. Accordingly, a description of the switching transistor is replaced with a description of the driving transistor Tdr for descriptive convenience.

The driving transistor Tdr may include a semiconductor pattern SCL, a gate electrode GE, a first terminal SE, and a second terminal DE. The first terminal SE may be any one of a source electrode and a drain electrode, and the second terminal DE may be the other electrode. For example, in case that the first terminal SE is a source electrode, the second terminal DE may be a drain electrode.

The semiconductor pattern SCL may be disposed and/or formed on the buffer layer BFL. The semiconductor pattern SCL may include a first contact area contacting the first terminal SE and a second contact area contacting the second terminal DE. An area, which is positioned between the first contact area and the second contact area and overlaps the gate electrode GE, may be a channel area of the driving transistor Tdr. The semiconductor pattern SCL may be a semiconductor pattern formed of polysilicon, amorphous silicon, oxide semiconductor, or the like. The channel area may be a semiconductor pattern that is not doped with an impurity (e.g., dopant), and may be an intrinsic semiconductor, but embodiments are not limited thereto. According to an embodiment, the channel area may be a semiconductor pattern doped with an impurity (e.g., dopant). The first contact area and the second contact area may be semiconductor patterns doped with an impurity (e.g., dopant).

The gate electrode GE may be disposed and/or formed on the semiconductor pattern SCL with a gate insulating layer GI interposed therebetween. For example, the gate electrode GE may be disposed and/or formed on the gate insulating layer GI. The gate electrode GE may be formed of at least one or a metal such as gold (Au), silver (Ag), aluminum (Al), molybdenum (Mo), chromium (Cr), titanium (Ti), nickel (Ni), neodymium (Nd), and copper (Cu), or an alloy of the metals. For example, the gate electrode GE may be formed as a single layer, but is not limited thereto, and may be formed as multiple layers in which at least two or more of the metals and the alloys are stacked with each other.

The gate insulating layer GI may be disposed and/or formed on the semiconductor pattern SCL. The gate insulating layer GI may be an inorganic insulating layer including an inorganic material. For example, the gate insulating layer GI may include at least one of metal oxide such as silicon nitride ($SiN_x$), silicon oxide ($SiO_x$), silicon oxynitride (SiON), and aluminum oxide ($AlO_x$). However, the material of the gate insulating layer GI is not limited to the above-described embodiments. According to an embodiment, the gate insulating layer GI may be formed of an organic insulating layer including an organic material. The gate insulating layer GI may be formed as a single layer, but may also be formed as multiple layers of at least double layers.

The respective first terminal SE and second terminal DE may be in contact with the first contact area and the second contact area of the semiconductor pattern SCL through a contact hole passing through an interlayer insulating layer ILD and the gate insulating layer GI. For example, the first terminal SE may be in contact with a contact area of the first and second contact areas of the semiconductor pattern SCL, and the second terminal DE may be in contact with a remaining contact area of the first and second contact areas of the semiconductor pattern SCL. The first and second terminals SE and DE may be formed of at least one of a metal such as gold (Au), silver (Ag), aluminum (Al), molybdenum (Mo), chromium (Cr), nickel (Ni), neodymium (Nd), and copper (Cu), or an alloy of the metals. For example, the first and second terminals SE and DE may be formed as a single layer, but embodiments are not limited thereto, and may be formed as multiple layers in which at least two or more of the metals and the alloys are stacked with each other.

The interlayer insulating layer ILD may be disposed and/or formed on the gate electrode GE. The interlayer insulating layer ILD may be an inorganic insulating layer including an inorganic material. For example, the interlayer insulating layer ILD may include at least one of a metal oxide such as silicon oxide ($SiO_x$), silicon nitride ($SiN_x$), silicon oxynitride (SiON), and aluminum oxide ($AlO_x$). The interlayer insulating layer ILD may be formed as a single layer or multiple layers. According to an embodiment, the interlayer insulating layer ILD may be an organic insulating layer including an organic material.

In the above-described embodiment, the first and second terminals SE and DE of the driving transistor Tdr are separate electrodes electrically connected to the semiconductor pattern SCL through a contact hole passing through the gate insulating layer GI and the interlayer insulating layer ILD, but embodiments are not limited thereto. According to an embodiment, the first terminal SE of the driving transistor Tdr may be a contact area of the first and second contact areas adjacent to the channel area of the semiconductor pattern SCL, and the second terminal DE of the driving transistor Tdr may be a remaining contact area of the first and second contact areas adjacent to the channel area of the semiconductor pattern SCL. The second terminal DE of the driving transistor Tdr may be electrically connected to the light emitting element LD of each pixel PXL through separate connection parts including a bridge electrode or a contact electrode.

According to an embodiment, a sub-interlayer insulating layer may be disposed and/or formed on the first and second terminals SE and DE of the driving transistor Tdr. A first additional electrode (e.g., a first connection electrode) corresponding to the first terminal SE and a second additional electrode (or a second connection electrode) corresponding to the second terminal DE may be disposed and/or formed on the sub-interlayer insulating layer. The first additional electrode (e.g., the first connection electrode) may be electrically connected to the first terminal SE disposed thereunder through a contact hole passing through the sub-interlayer insulating layer, and the second additional electrode (e.g., the second connection electrode) may be electrically connected to the second terminal DE disposed thereunder through a contact hole passing through the sub-interlayer insulating layer.

In an embodiment, the transistors T included in the pixel circuit 144 may be formed as low-temperature polycrystalline silicon (LTPS) thin film transistors, but embodiments are not limited thereto, and may be formed as an oxide semiconductor thin film transistor according to an embodiment. For example, a case where the transistors T are thin film transistors having a top gate structure is described as an example, but embodiments are not limited thereto. According to an embodiment, the transistors T may be thin film transistors having a bottom gate structure.

The protective layer PSV may be disposed and/or formed on the pixel circuit 144 including the driving transistor Tdr.

The protective layer PSV may be formed to include an organic insulating layer, an inorganic insulating layer, or an organic insulating layer disposed on the inorganic insulating layer. The inorganic insulating layer may include, for example, at least one of metal oxide such as silicon oxide ($SiO_x$), silicon nitride ($SiN_x$), silicon oxynitride (SiON), and aluminum oxide ($AlO_x$). The organic insulating layer may include, for example, at least one of an acrylic resin (e.g., polyacrylates resin), an epoxy resin, a phenolic resin, a polyamide resin, a polyimides resin, an unsaturated polyesters resin, a poly-phenylene ethers resin, a poly-phenylene sulfides resin, and a benzocyclobutene resin.

The display element layer DPL may be disposed and/or formed on the protective layer PSV.

The display element layer DPL may be disposed on the protective layer PSV and may include the light emitting element LD that emits light. The light emitting element LD may include first and second electrodes AE and CE and an emission layer EML disposed between the two electrodes AE and CE. At this time, one of the first and second electrodes AE and CE may be an anode electrode, and a remaining electrode may be a cathode electrode. In case that the light emitting element LD is a front surface emission type organic light emitting diode, the first electrode AE may be a reflective electrode, and the second electrode CE may be a transmissive electrode. In an embodiment, a case in which the light emitting element LD is the front surface emission type organic light emitting diode and the first electrode AE is the anode electrode is described as an example.

The first electrode AE may be electrically connected to the second terminal DE of the driving transistor Tdr through a contact hole passing through the protective layer PSV. The first electrode AE may include a reflective layer capable of reflecting light or a transparent conductive layer disposed on or under the reflective layer. For example, the first electrode AE may be formed as multiple layers including a lower transparent conductive layer formed of indium tin oxide (ITO), a reflective layer disposed on the lower transparent conductive layer and formed of silver (Ag), and an upper transparent conductive layer disposed on the reflective layer and formed of indium tin oxide (ITO). At least one of the transparent conductive layer and the reflective layer may be electrically connected to the second terminal DE of the driving transistor Tdr.

The display element layer DPL may further include a pixel defining layer PDL having an opening exposing a portion of the first electrode AE, for example, an upper surface of the first electrode AE. The pixel defining layer PDL may be an organic insulating layer including an organic material. For example, the pixel defining layer PDL may be formed of an organic insulating material such as an acryl resin, an epoxy resin, a phenolic resin, a polyamide resin, or a polyimide resin.

The emission layer EML may be disposed in an area corresponding to the opening of the pixel defining layer PDL. For example, the emission layer EML may be disposed on a surface of the exposed first electrode AE. The emission layer EML may have a multilayer thin film structure including at least one light generation layer (or light emission layer). The emission layer EML may include a hole injection layer that injects a hole, a hole transport layer having an excellent hole transport property and for increasing a chance of recombination of a hole and an electron by suppressing a movement of an electron that is not combined in the light generation layer, the light generation layer that emits light by the recombination of the injected electron and hole, a hole blocking layer for suppressing a movement of a hole that is not combined in the light generation layer, an electron transport layer for smoothly transporting the electron to the light generation layer, and an electron injection layer for injecting the electron.

A color of the light generated in the light generating layer may be one of red, green, blue, and white, but embodiments are not limited thereto. For example, the color of the light generated in the light generating layer of the emission layer EML may be one of magenta, cyan, and yellow. The hole injection layer, the hole transport layer, the hole blocking layer, the electron transport layer, and the electron injection layer may be a common layer connected in emission areas adjacent to each other.

The second electrode CE may be disposed and/or formed on the emission layer EML. The second electrode CE may be a common layer commonly included in the pixels PXL, but embodiments are not limited thereto. The second electrode CE may be a transmissive electrode and may include a transparent conductive material (or substance). The transparent conductive material (or substance) may include transparent conductive oxide such as indium tin oxide (ITO), indium zinc oxide (IZO), zinc oxide (ZnO), and indium tin zinc oxide (ITZO), a conductive polymer such as PEDOT, and the like.

The thin film encapsulation layer TFE may be disposed and/or formed on the second electrode CE.

The thin film encapsulation layer TFE may be formed as a single layer, but may also be formed as multiple layers. The thin film encapsulation layer TFE may include insulating layers covering the light emitting element OLED. For example, the thin film encapsulation layer TFE may include at least one inorganic layer and at least one organic layer. For example, the thin film encapsulation layer TFE may have a structure in which an inorganic layer and an organic layer are alternately stacked with each other. According to an embodiment, the thin film encapsulation layer TFE may be an encapsulation substrate disposed on the light emitting element OLED and bonded to the substrate SUB through a sealant.

The thin film encapsulation layer TFE may include first to third encapsulation layers ENC1 to ENC3. The first encapsulation layer ENC1 may be disposed and/or formed on the display element layer DPL and may be positioned over at least a portion of the display area DA and the non-display area NDA. The second encapsulation layer ENC2 may be disposed and/or formed on the first encapsulation layer ENC1 and may be positioned over at least a portion of the display area DA and the non-display area NDA. The third encapsulation layer ENC3 may be disposed and/or formed on the second encapsulation layer ENC2 and may be positioned over at least a portion of the display area DA and the non-display area NDA. According to an embodiment, the third encapsulation layer ENC3 may be positioned over the entire display area DA and non-display area NDA. In an embodiment, the first and third encapsulation layers ENC1 and ENC3 may include an inorganic layer including an inorganic material, and the second encapsulation layer ENC2 may include an organic layer including an organic material.

In the above-described embodiment, an example in which the display element layer DPL includes the light emitting element LD formed as the front surface emission type organic light emitting diode having the first electrode AE, the emission layer EML, and the second electrode CE is described, but embodiments are not limited thereto.

Figure 8:
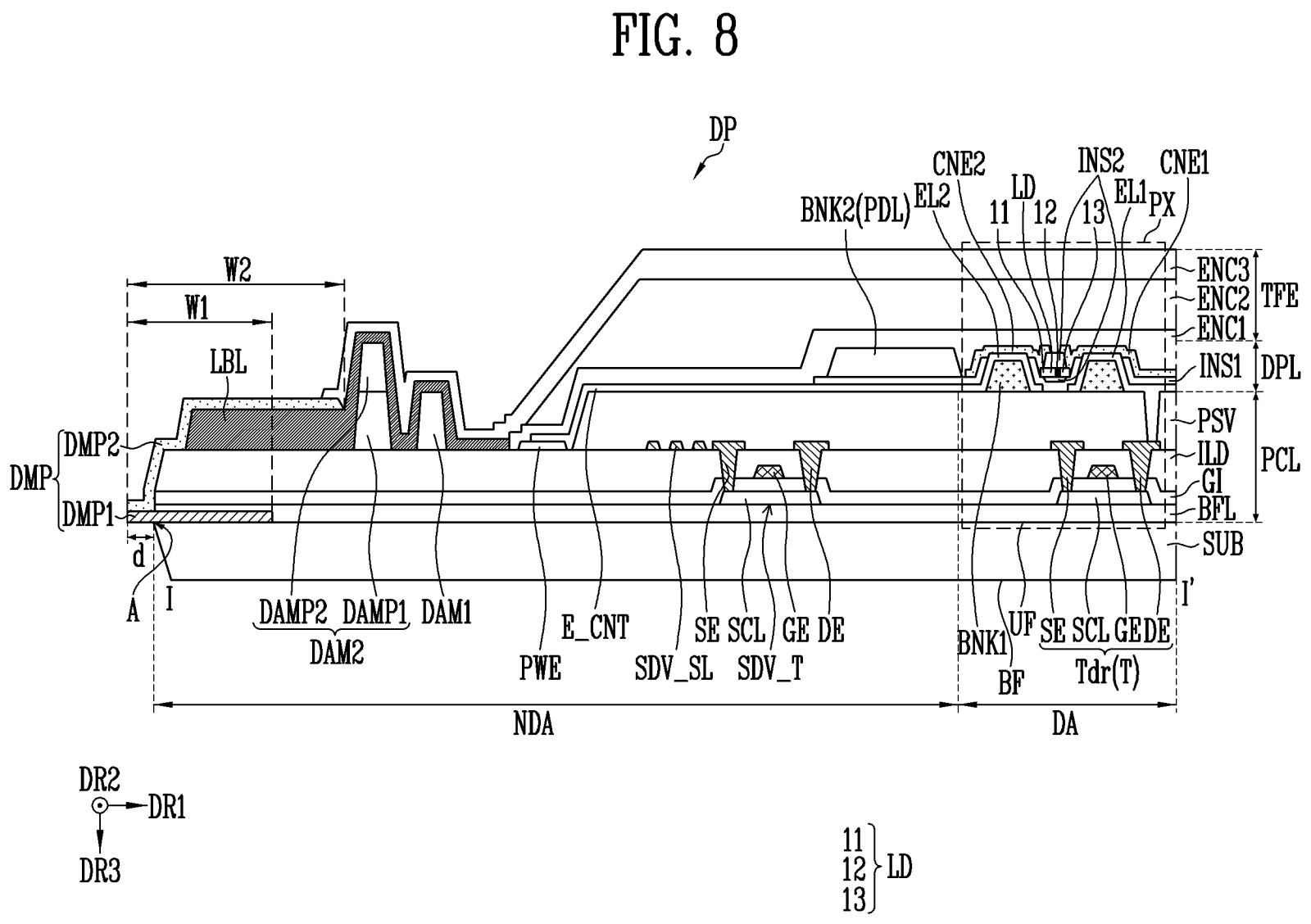

According to an embodiment, as shown in FIG. 8, the display element layer DPL may include at least one ultra-small inorganic light emitting element LD (or light emitting diode) as small as a micro-scale or a nano-scale formed in a structure in which a nitride-based semiconductor is grown. The display element layer DPL may include first and second bank patterns BNK1 and BNK2, first and second alignment electrodes EL1 and EL2, and first and second insulating layers INS1 and INS2, and first and second contact electrodes CNE1 and CNE2. Here, the light emitting element LD may have the same configuration (or structure) as each light emitting element LD described with reference to FIG. 5B, and may replace each of the light emitting elements LD.

The first bank pattern BNK1 may be disposed and/or formed on the protective layer PSV, and may be positioned in the emission area from which light is emitted from each pixel PXL. The first bank pattern BNK1 may support each of the first and second alignment electrodes EL1 and EL2 in order to change a surface profile (or shape) each of the first and second alignment electrodes EL1 and EL2 to guide the light emitted from the light emitting elements LD in an image display direction of the display device DD. The first bank pattern BNK1 may include an inorganic insulating layer formed of an inorganic material or an organic insulating layer formed of an organic material. According to an embodiment, the first bank pattern BNK1 may include an organic insulating layer as a single layer and/or an inorganic insulating layer as a single layer, but embodiments are not limited thereto.

The second bank pattern BNK2 may surround at least one side of a peripheral area of each pixel PXL. The peripheral area may include a non-emission area from which light is not emitted. The second bank pattern BNK2 may be a structure defining (or partitioning) the emission area of each of the pixels PXL, and may be, for example, a pixel defining layer PDL. The second bank pattern BNK2 may include at least one light blocking material and/or reflective material to prevent a light leakage defect in which light (or rays) is leaked between the pixels PXL.

Each of the first and second alignment electrodes EL1 and EL2 may be disposed and/or formed on the first bank pattern BNK1 to have a surface profile corresponding to a shape of the first bank pattern BNK1. Each of the first and second alignment electrodes EL1 and EL2 may be formed of a material having a constant reflectance to allow the light emitted from each of the light emitting elements LD to proceed in the image display direction of the display device. The first alignment electrode EL1 may be electrically connected to the second terminal DE of the driving transistor Tdr through a contact hole passing through the protective layer PSV, and the second alignment electrode EL2 may be electrically and/or physically connected to a connection electrode E_CNT positioned in the non-display area NDA. The first alignment electrode EL1 may be an anode electrode, and the second alignment electrode EL2 may be a cathode electrode. In an embodiment, the first alignment electrode EL1 may be a configuration corresponding to the first electrode AE described with reference to FIG. 7, and the second alignment electrode EL2 may be a configuration corresponding to the second electrode CE described with reference to FIG. 7.

The light emitting elements LD may be disposed between the first alignment electrode EL1 and the second alignment electrode EL2 and may be electrically connected to each of the first and second alignment electrodes EL1 and EL2. Each of the light emitting elements LD may emit any one of color light and/or white light. The light emitting elements LD may be formed in a form of being sprayed into a solution and may be injected into each pixel PXL. Each of the light emitting elements LD may include an emission stack pattern in which a first semiconductor layer 11, an active layer 12, and a second semiconductor layer 13 are sequentially stacked along a direction, for example, the first direction DR1. For example, each of the light emitting elements LD may include an insulating layer surrounding an outer circumferential surface of the emission stack pattern.

In an embodiment, the first semiconductor layer 11 may include at least one n-type semiconductor layer. For example, the first semiconductor layer 11 may include a semiconductor material of any one of InAlGaN, GaN, AlGaN, InGaN, AlN, and InN, and may be an n-type semiconductor layer doped with a first conductive dopant (or an n-type dopant) such as Si, Ge, or Sn. The active layer 12 may be disposed on the first semiconductor layer 11 and may be formed in a single or multiple quantum well structure. The second semiconductor layer 13 may be disposed on the active layer 12, and may include a semiconductor layer of a type different from that of the first semiconductor layer 11. For example, the second semiconductor layer 13 may include at least one p-type semiconductor layer. For example, the second semiconductor layer 13 may include at least one semiconductor material of InAlGaN, GaN, AlGaN, InGaN, AlN, and InN, and may include a p-type semiconductor layer doped with a second conductive dopant (or a p-type dopant) such as Mg.

The light emitting elements LD may be disposed and/or formed on the first insulating layer INS1. The first insulating layer INS1 may be disposed and/or formed between each of the first and second alignment electrodes EL1 and EL2 and the protective layer PSV. The first insulating layer INS1 may fill a space between each of the light emitting elements LD and the protective layer PSV to stably support (or fix) the light emitting elements LD. The first insulating layer INS1 may include an inorganic insulating layer formed of an inorganic material or an organic insulating layer formed of an organic material.

The second insulating layer INS2 may be disposed and/or formed on the light emitting elements LD. The second insulating layer INS2 may be disposed and/or formed on each of the light emitting elements LD to cover a portion of an upper surface of each of the light emitting elements LD, and may expose both ends (e.g., opposite ends) of each of the light emitting elements LD to the outside. The second insulating layer INS2 may further fix each of the light emitting elements LD. In case that a gap (or space) exists between the first insulating layer INS1 and the light emitting elements LD before formation of the second insulating layer INS2, the gap may be filled with the second insulating layer INS2.

On the first alignment electrode EL1, a first contact electrode CNE1 electrically and/or physically and stably connecting the first alignment electrode EL1 and an end of the both ends (e.g., opposite ends) of each of the light emitting elements LD may be disposed and/or formed. On the second alignment electrode EL2, a second contact electrode CNE2 electrically and/or physically and stably connecting the second alignment electrode EL2 and the other end of the both ends (e.g., opposite ends) of each of the light emitting elements LD may be disposed and/or formed. The first and second contact electrodes CNE1 and CNE2 may be formed of various transparent conductive materials such that the light emitted from each of the light emitting elements LD and reflected by the first and second alignment electrodes EL1 and EL2 proceeds (or is guided) in the image display direction of the display device without loss (or absorption).

Figure 7:
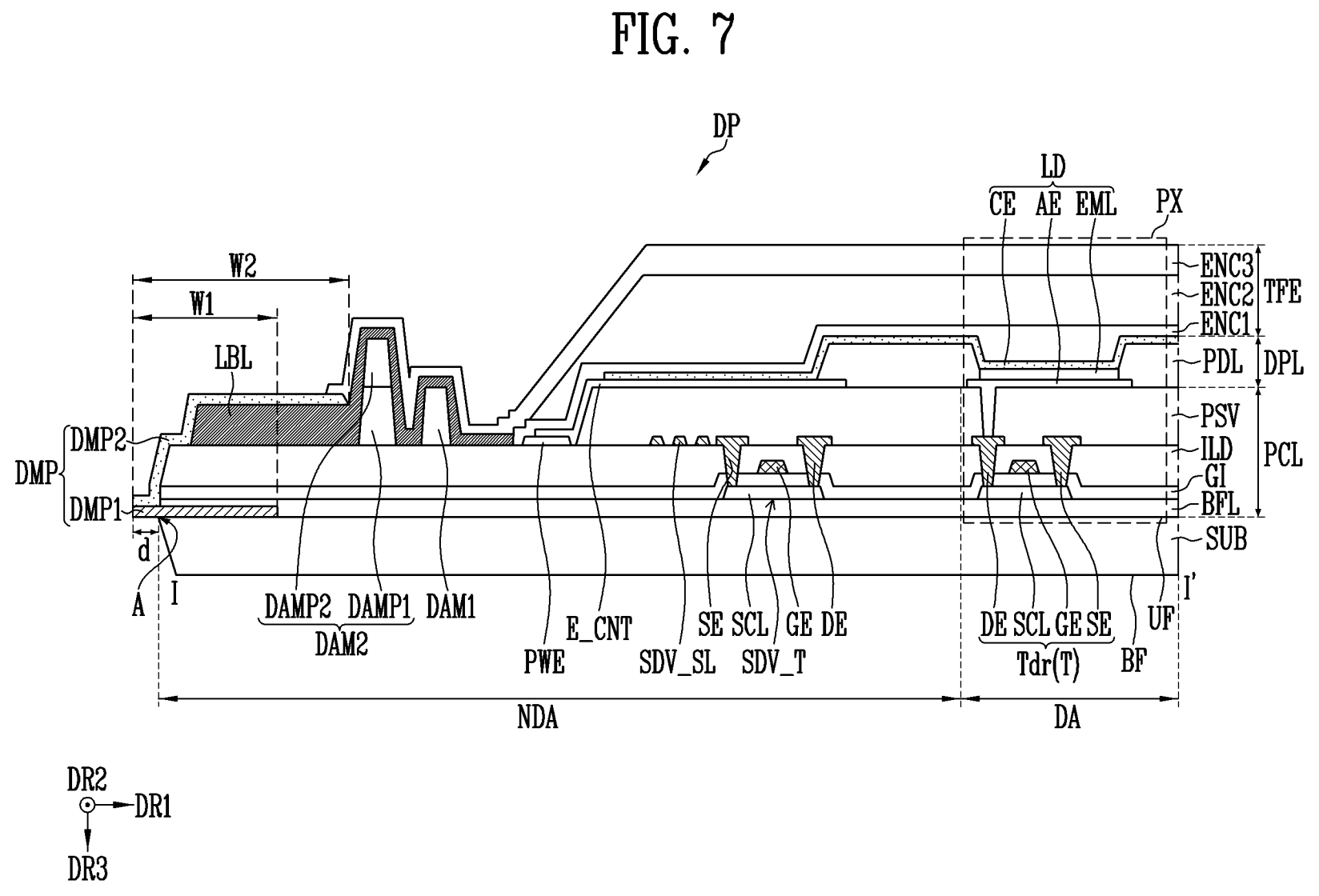

For example, as shown in FIGS. 7 and 8, some configurations included in the pixel unit PX (or the display unit) may be disposed in the non-display area NDA. For example, a portion of the pixel circuit layer PCL, a portion of the display element layer DPL, and the thin film encapsulation layer TFE may be disposed in the non-display area NDA.

The driver included in the pixel circuit layer PCL and the line unit included in the pixel circuit layer PCL and connecting the driver and the pixels PXL may be positioned in the non-display area NDA. The driver may include at least one driving transistor SDV_T formed by the same process as the driving transistor Tdr of the pixel unit PX (or the display unit). The driving transistor SDV_T may include the semiconductor pattern SCL, the gate electrode GE, the source electrode SE, and the drain electrode DE. The line unit may include signal lines SDV_SL connecting the driver and the pixels PXL. Here, the signal lines SDV_SL may be fan-out lines.

For example, in the non-display area NDA, a power electrode PWE receiving the second pixel power ELVSS or the second driving power VSS from the outside, and the connection electrode E_CNT connected to the power electrode PWE may be disposed. The connection electrode E_CNT may electrically connect the power electrode PWE and the second electrode CE of the light emitting element LD as shown in FIG. 7. For example, the connection electrode E_CNT may electrically connect the power electrode PWE and the second alignment electrode EL2 as shown in FIG. 8. As shown in FIG. 7, the connection electrode E_CNT and the first electrode AE of the light emitting element LD may be formed by the same process, and may include the same layer structure and the same material. However, embodiments are not limited thereto, and according to an embodiment, the connection electrode E_CNT and one conductive layer among conductive layers in the pixel circuit layer PCL in a range (or area) electrically connecting the power electrode PWE and the second electrode CE may be formed on the same layer (e.g., the protective layer PSV). According to an embodiment, as shown in FIG. 8, the connection electrode E_CNT and the first and second alignment electrodes EL1 and EL2 may be formed by the same process, and may include the same layer structure and the same material.

The dam unit DAM may be disposed along an edge of the display area DA, and may be positioned between the dummy unit DMP and the pixel unit PX (or the display unit) in the non-display area NDA. The dam unit DAM may include a first dam unit DAM1 and a second dam unit DAM2. The second dam unit DAM2 may be disposed outside the first dam unit DAM1. The first dam unit DAM1 may be formed simultaneously with the protective layer PSV included in the pixel circuit layer PCL. The second dam unit DAM2 may include a lower portion DAMP1 formed simultaneously with the protective layer PSV included in the pixel circuit layer PCL, and an upper portion DAMP2 formed simultaneously with the pixel defining layer PDL included in the display element layer DPL. In the above-described embodiment, the dam unit DAM is formed simultaneously with the organic insulating layers included in the pixel unit PX (or the display unit), but embodiments are not limited thereto. According to an embodiment, the dam unit DAM may be simultaneously formed with at least one insulating layer among inorganic insulating layers included in the pixel unit PX (or the display unit).

The dam unit DAM may prevent a liquid organic material from overflowing into an outer area of the substrate SUB in a process of forming the organic layer included in the thin film encapsulation layer TFE, for example, the second encapsulation layer ENC2.

The dummy unit DMP may be positioned outside the dam unit DAM and may be disposed along the edge (or the outer area) of the substrate SUB. In an embodiment, the dummy unit DMP may include a first dummy pattern DMP1 (e.g., a first dummy part) and a second dummy pattern DMP2 (e.g., a second dummy part).

In an embodiment, the first dummy pattern DMP1 may be positioned between the substrate SUB and the pixel circuit layer PCL in the non-display area NDA. For example, the first dummy pattern DMP1 may be positioned between the substrate SUB and the buffer layer BFL. The first dummy pattern DMP1 may be disposed along the edge (or the outer area) of the substrate SUB, and may overlap the edge (or the outer area) of the substrate SUB.

The first dummy pattern DMP1 may function as an etch stopper that prevents the substrate SUB from being excessively etched by an etching gas in a manufacturing process of the display device DD. To this end, the first dummy pattern DMP1 may be formed of a material (or a substance) that is less affected by the etching gas in order to prevent a portion of the substrate SUB from being excessively etched in case that the mother substrate (or the mother glass) is disposed as the display panel DP of a cell unit by performing a dry etching method. For example, the first dummy pattern DMP1 may include a transparent conductive material (or substance) that may include transparent conducting oxide (TCO) such as indium tin oxide (ITO), indium zinc oxide (IZO), zinc oxide (ZnO), or indium tin zinc oxide (ITZO).

In an embodiment, the second dummy pattern DMP2 may be positioned between the pixel circuit layer PCL and the display element layer DPL in the non-display area NDA. The second dummy pattern DMP2 may be disposed on the first dummy pattern DMP1 and surround an end of the pixel circuit layer PCL in order to prevent the end of the pixel circuit layer PCL positioned in the non-display area NDA from being exposed to the outside. For example, the second dummy pattern DMP2 may function as a protection member protecting the end of the pixel circuit layer PCL. The second dummy pattern DMP2 may minimize damage of configurations disposed on a surface UF (or the upper surface) of the substrate SUB, for example, the buffer layer BFL and the insulating layers disposed on the buffer layer BFL in the manufacturing process of the display device DD. To this end, the second dummy pattern DMP2 may be formed of a material (or substance) having a small (or less) influence by an etching gas used in a process of performing the dry etching method. The second dummy pattern DMP2 and the first dummy pattern DMP1 may include the same material (e.g., substance). For example, the second dummy pattern DMP2 may include a transparent conductive oxide.

The second dummy pattern DMP2 may be formed in the same process as some configurations included in the display element layer DPL. For example, as shown in FIG. 7, the second dummy pattern DMP2 and the second electrode CE may be formed in the same process in case that the second electrode CE included in the display element layer DPL is formed as a transmissive electrode, and may include the same material. However, embodiments are not limited thereto, and according to an embodiment, the second dummy pattern DMP2 may be formed in a process different from that of the second electrode CE and may be disposed on a layer different from that of the second electrode CE.

For example, according to an embodiment, as shown in FIG. 8, the second dummy pattern DMP2 and the first and second contact electrodes CNE1 and CNE2 included in the display element layer DPL may be formed in the same process, and may include the same material.

In a plan view and in a cross-sectional view, the first dummy pattern DMP1 and the second dummy pattern DMP2 may overlap each other. In a cross-sectional view, the first and second dummy patterns DMP1 and DMP2 may extend along the first direction DR1 from an edge end part A of the substrate SUB in the non-display area NDA and may be positioned in a range that does not overlap the dam unit DAM. Here, the edge end part A of the substrate SUB may be an edge where the surface UF (or the upper surface) of the substrate SUB and a side surface, which connects the surface UF (or the upper surface) and another surface BF (or a rear surface), contact. However, embodiments are not limited thereto, and positions of the first and second dummy patterns DMP1 and DMP2 may be variously changed within a range capable of ensuring electrical insulation from the driver disposed in the non-display area NDA.

Each of the first and second dummy patterns DMP1 and DMP2 may maintain a state electrically separated (or insulated) from a configuration (or structure) to which any signal (or voltage) is applied from the outside. For example, each of the first and second dummy patterns DMP1 and DMP2 may maintain a state electrically separated from a configuration (or structure) to which a predetermined signal (or voltage) is applied in the display device DD.

In an embodiment, a width W2 of the second dummy pattern DMP2 in the first direction DR1 and a width W1 of the first dummy pattern DMP1 in the first direction DR1 may be different from each other. For example, the width W2 of the second dummy pattern DMP2 in the first direction DR1 may be greater than the width W1 of the first dummy pattern DMP1 in the first direction DR1, but embodiments are not limited thereto. According to an embodiment, as another example, the width W1 of the first dummy pattern DMP1 in the first direction DR1 may be greater than the width W2 of the second dummy pattern DMP2 in the first direction DR1. For example, according to an embodiment, the width W2 of the second dummy pattern DMP2 in the first direction DR1 and the width W1 of the first dummy pattern DMP1 in the first direction DR1 may be substantially identical to each other.

The first and second dummy patterns DMP1 and DMP2 may protrude from the edge end part A of the substrate SUB in a direction away from the pixel unit PX (or the display unit) in the first direction DR1. For example, the first and second dummy patterns DMP1 and DMP2 may protrude outward from the edge end part A of the substrate SUB. For example, the first and second dummy patterns DMP1 and DMP2 may include a protrusion that does not overlap the substrate SUB and faces to the outside of the substrate SUB. In an embodiment, an end of the protrusion of the first dummy pattern DMP1 and an end of the protrusion of the second dummy pattern DMP2 may coincide (or contact) with each other. A width d of the protrusion of the first dummy pattern DMP1 in the first direction DR1 and a width d of the protrusion of the second dummy pattern DMP2 in the first direction DR1 may be substantially identical to each other. For example, the width d of each of the first and second dummy patterns DMP1 and DMP2 in the first direction DR1 may be about 0 m to about 5 m, but embodiments are not limited thereto. In the above-described embodiment, the width d of the first dummy pattern DMP1 in the first direction DR1 and the width d of the second dummy pattern DMP2 in the first direction DR1 are substantially identical to each other, but embodiments are not limited thereto. According to an embodiment, the width d of the protrusion of the first dummy pattern DMP1 in the first direction DR1 and the width d of the protrusion of the second dummy pattern DMP2 in the first direction DR1 may be different from each other.

A portion of the substrate SUB may be removed in a process of manufacturing the mother substrate (or the mother glass) in a display panel DP, and thus the first and second dummy patterns DMP1 and DMP2 may protrude outward from the edge end part A of the substrate SUB.

A light blocking layer LBL may be disposed in the non-display area NDA. The light blocking layer LBL may be disposed between the first dummy pattern DMP1 and the second dummy pattern DMP2. For example, the light blocking layer LBL may be disposed on the interlayer insulating layer ILD in the pixel circuit layer PCL positioned in the non-display area NDA and may be disposed between the first dummy pattern DMP1 and the second dummy pattern DMP2, but embodiments are not limited thereto. According to an embodiment, the light blocking layer LBL may be disposed on an insulating layer among the insulating layers included in the pixel circuit layer PCL positioned in the non-display area NDA or may be disposed on an insulating layer among the insulating layers included in the display element layer DPL positioned in the non-display area NDA. In an embodiment, the light blocking layer LBL may be a visibility preventing member that prevents the first and second dummy patterns DMP1 and DMP2 from being readily identified by a user. The light blocking layer LBL may be formed of a material (or substance) that has a certain level of dielectric constant and absorbs and/or blocks light. For example, the light blocking layer LBL may include a black matrix.

According to an embodiment, in case that the display device DD is manufactured with a large area, the display panel DP is manufactured by tiling, and at this time, in order to minimize a distance between adjacent display panels DP, a portion or the entire driver positioned in the non-display area NDA may be positioned on the other surface BF (e.g., the rear surface) of the substrate SUB of the corresponding display panel DP. The portion or the entire driver may be positioned on an insulating layer positioned on the other surface BF (e.g., the rear surface) of the substrate SUB, and may be electrically connected to a conductive layer of the pixel circuit layer PCL positioned on the surface UF (e.g., the upper surface) of the substrate SUB through a contact hole passing through the substrate SUB and the insulating layer.

Figure 9:
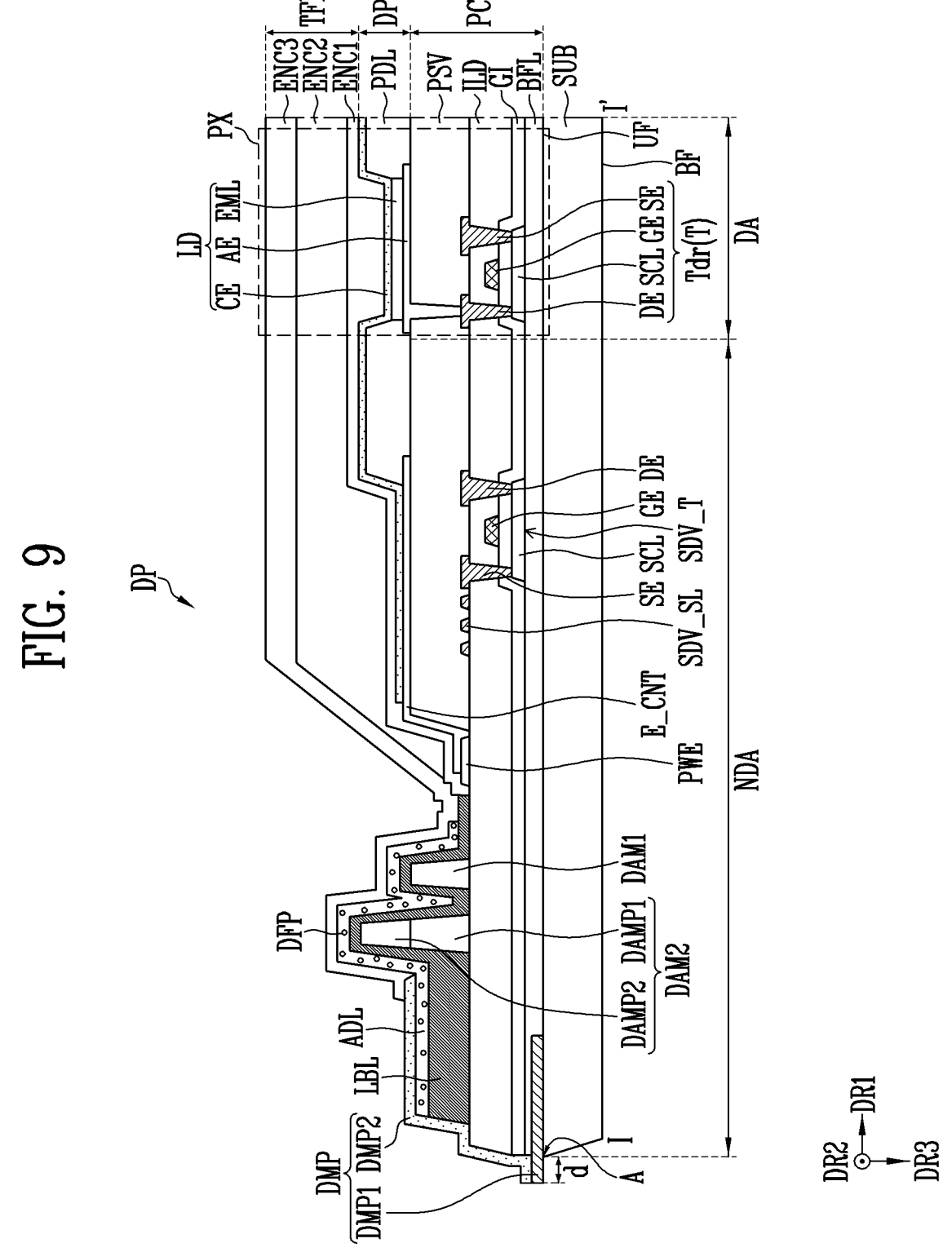

According to an embodiment, an auxiliary layer ADL may be disposed in the non-display area NDA as shown in FIG. 9. The auxiliary layer ADL may be disposed and/or formed between the light blocking layer LBL and the second dummy pattern DMP2.

In an embodiment, the auxiliary layer ADL may be a member that diffuses and/or scatters light entering from the outside in order to additionally prevent visibility of the first and second dummy patterns DMP1 and DMP2. For example, the auxiliary layer ADL may be formed of a diffusion ink material having a reflectance of a constant level or more. The diffusion ink material may be formed by including, for example, a polystyrene (PS) or polymethylmethacrylate (PMMA) bead, a solvent, a polystyrene (PS) or polymethacrylate (PMMA) copolymer, and an addition agent, but embodiments are not limited thereto. According to an embodiment, the auxiliary layer ADL may include a polymer material having light transmittance. For example, the polymer material may include polyethylene terephthalate, polyethylene naphthalate, polycarbonate, and polymethyl methacrylate. However, the material (or substance) of the auxiliary layer ADL is not limited to the above-described embodiments, and may be variously selected among materials (or substances) capable of readily diffusing and/or scattering light entering from the outside.

According to an embodiment, the auxiliary layer ADL may include fine particles DFP. The auxiliary layer ADL may include fine particles DFP for light diffusion and/or light scattering by being dispersed in a medium such as a transparent binder. The fine particles DFP may be referred to as diffusion particles, scattering particles, or the like. The fine particles DFP may have a size of several tens nanometer (nm) to several micrometer (m), but embodiments are not limited thereto. The binder may include a transparent material such as acrylic, urethane, or epoxy resin. As the fine particles DFP, a transparent particle or a white particle may be used.

The transparent particle may be, for example, a transparent organic particle or inorganic particle. For example, the organic particle may include methyl methacrylate (MMA), acrylic acid, glycidyl methacrylate, ethyl acrylate (EA), isobutyl acrylate, normal butyl acrylate, an acrylic particle of 2-ethyhexyl acrylate homopolymer or copolymer, an olefin-based particle such as polyethylene, polystyrene, and polypropylene, an acrylic and olefinic copolymer particle, a multi-layered multi-component particle formed by forming a homopolymer particle and covering a different type of monomer on the homopolymer particle, or the like. The inorganic particle may include, for example, precipitated silica, a glass bead, diamond, and the like. As the white particle, titanium oxide ($TiO_2$), zinc oxide (ZnO), barium sulfate ($BaSO_4$), calcium carbonate ($CaCO_3$), magnesium carbonate ($MgCO_3$), aluminum hydroxide ($Al(OH)_3$), clay, or the like may be used. For example, as the fine particle DFP, the above-described transparent particle or white particle may be used alone or by mixing two or more types of the above-described transparent particle or white particle.

Although the above-described fine particles DFP have been illustrated to have the same size, embodiments are not limited thereto. According to an embodiment, the fine particles DFP may have different sizes. For example, although it is illustrated that the fine particles DFP are regularly distributed in the auxiliary layer ADL, embodiments are not limited thereto. According to an embodiment, the fine particles DFP may be irregularly distributed, such as being biasedly distributed toward a side in the auxiliary layer ADL.

In case that light enters the non-display area NDA from the outside, the auxiliary layer ADL may diffuse and/or scatter the light to disperse the light in various directions. Accordingly, the auxiliary layer ADL may minimize the visibility of the first and second dummy patterns DMP1 and DMP2 together with the light blocking layer LBL.

As described above, according to an embodiment, damage of the configurations may be prevented by protecting the configurations positioned at the edge of the substrate SUB in case that proceeding a process of providing the mother substrate (or the mother glass) in a display panel DP through a dry etching method by disposing the dummy unit DMP along the edge of the substrate SUB.

For example, according to an embodiment, a dead space of the non-display area NDA may be minimized because an extra space for preventing damage by a laser beam is not required to be secured, by applying the dry etching method instead of a cutting method by using a laser beam in case that the mother substrate (or the mother glass) is disposed in a display panel DP unit.

Figure 10A:
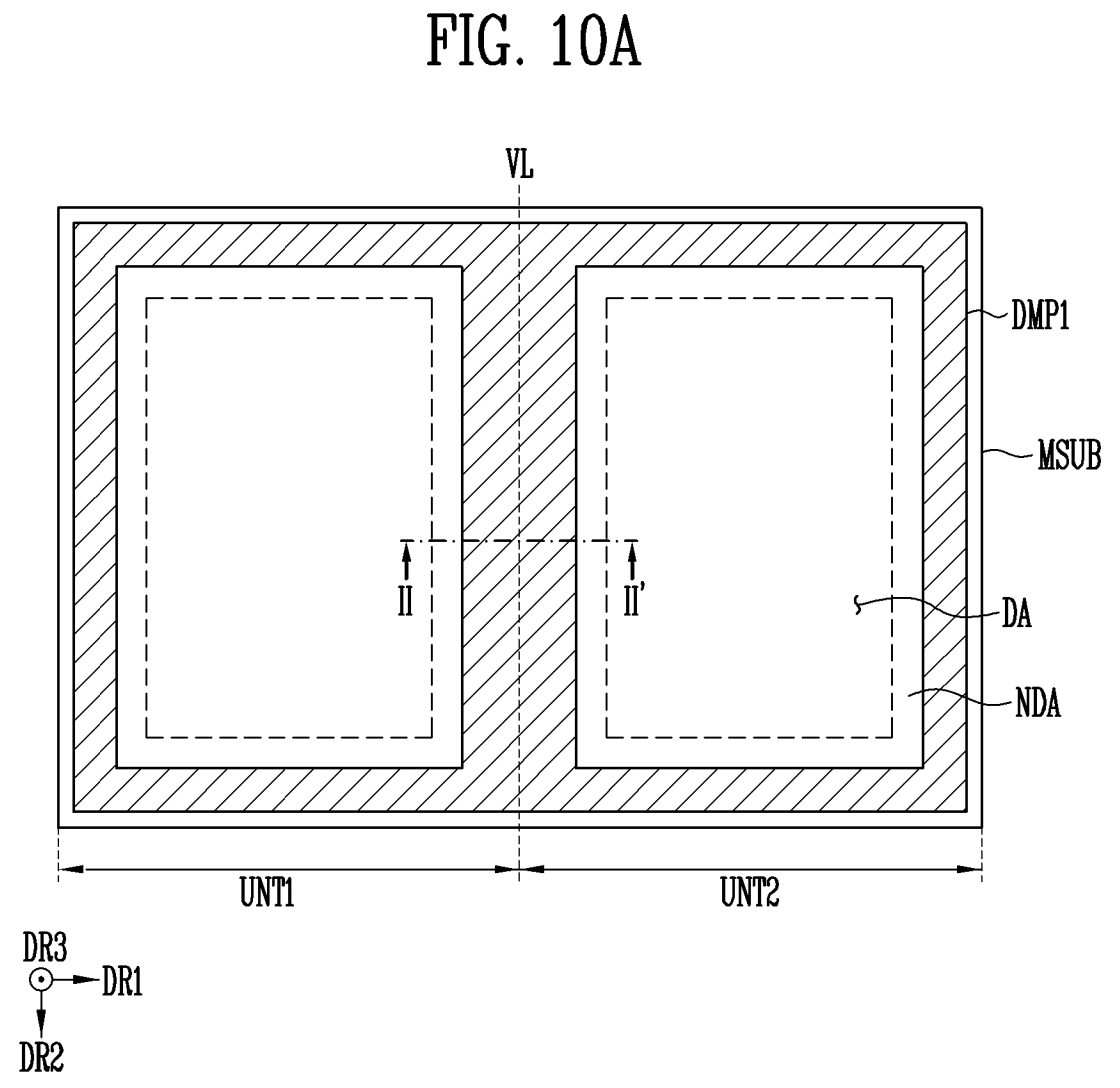
Figure 10B:
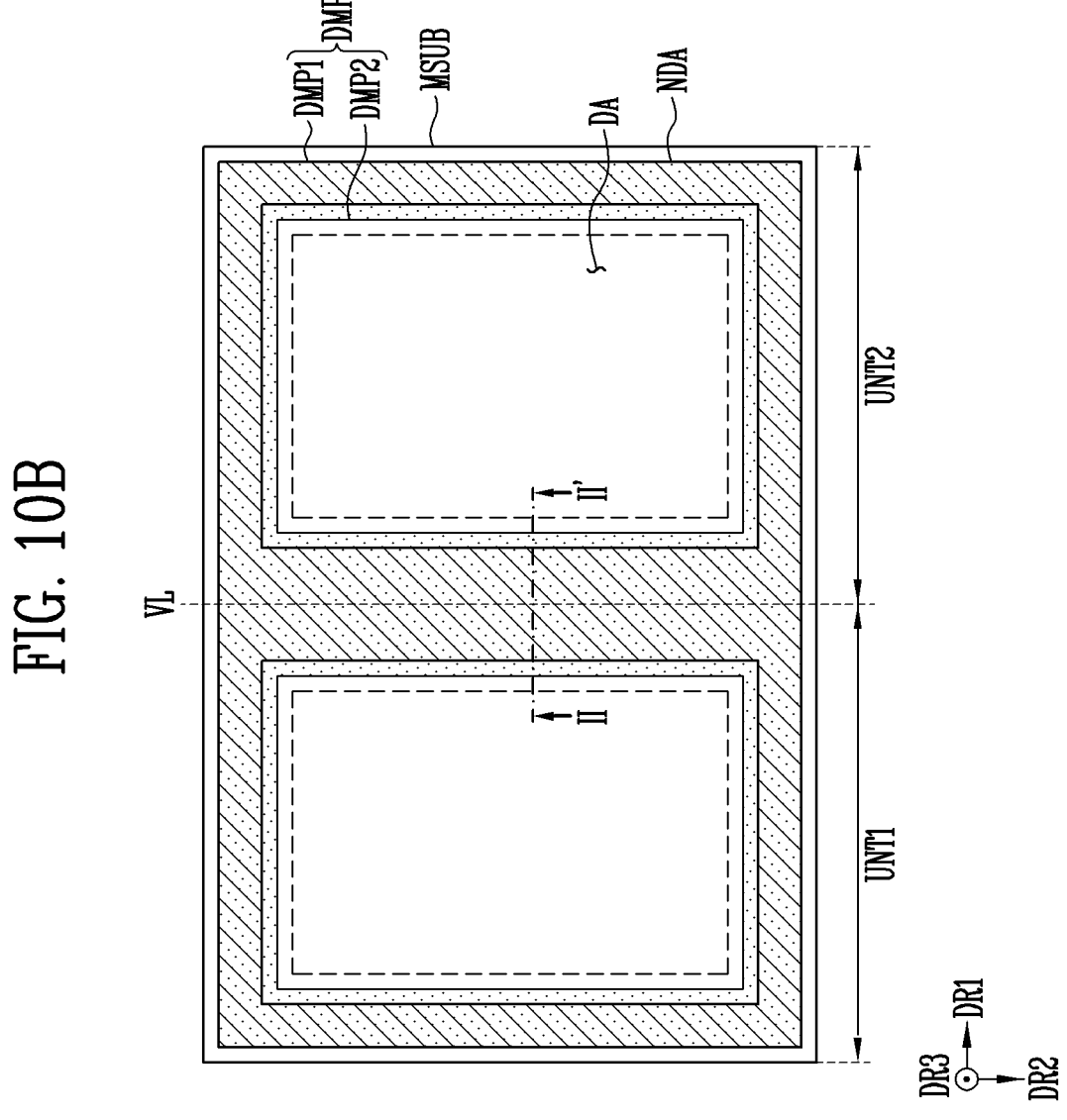
Figure 10C:
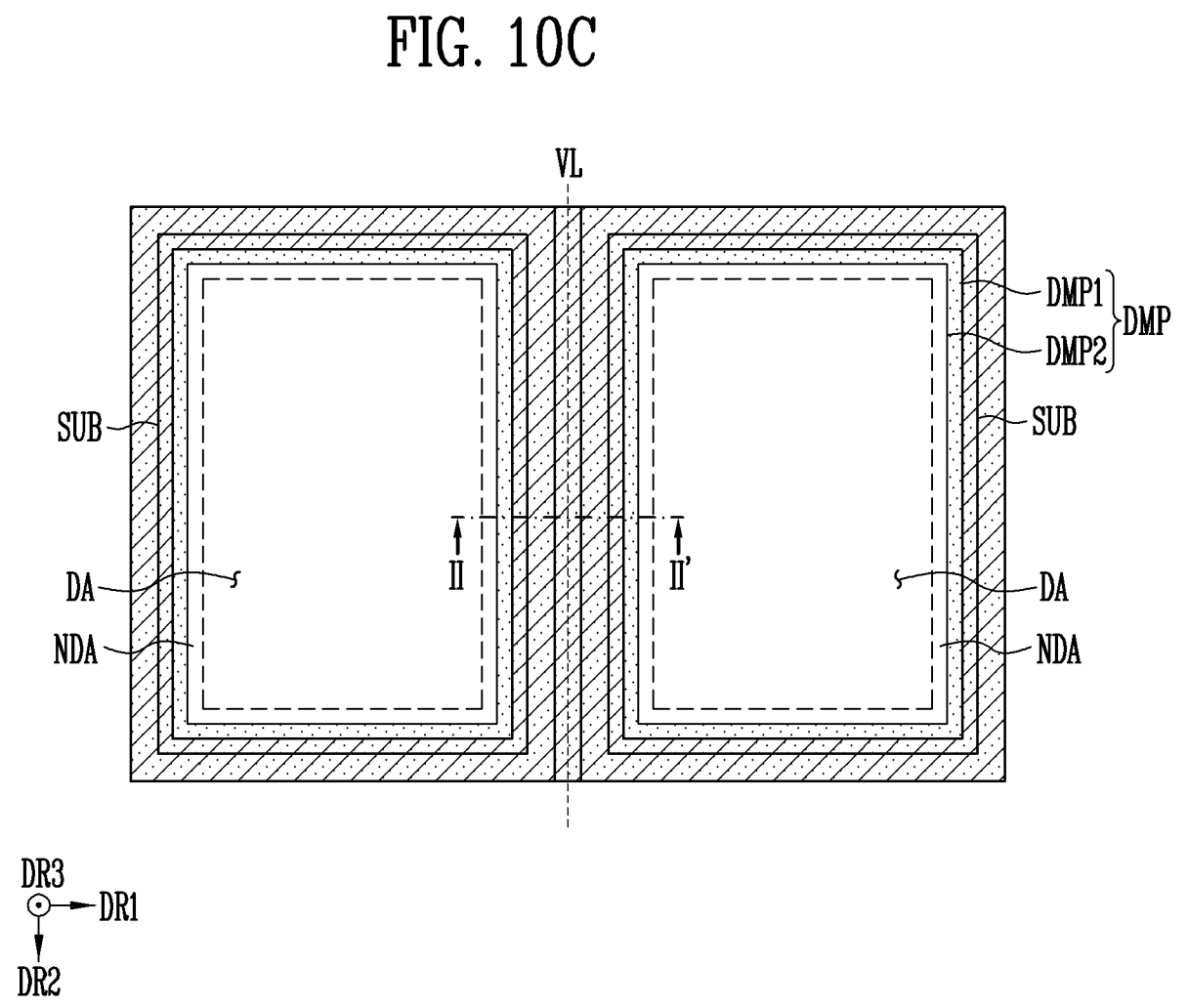
Figure 10D:
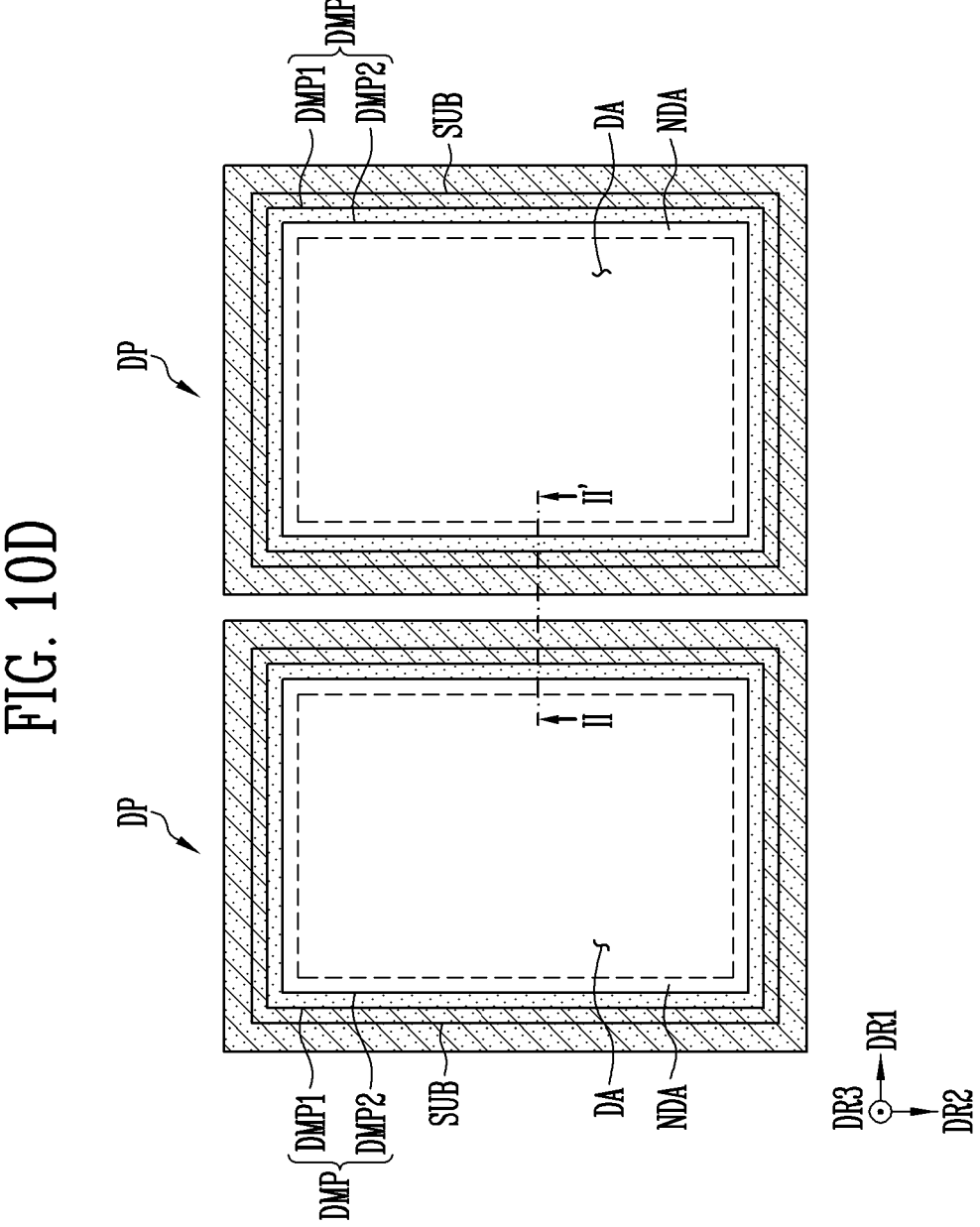
Figure 11A:
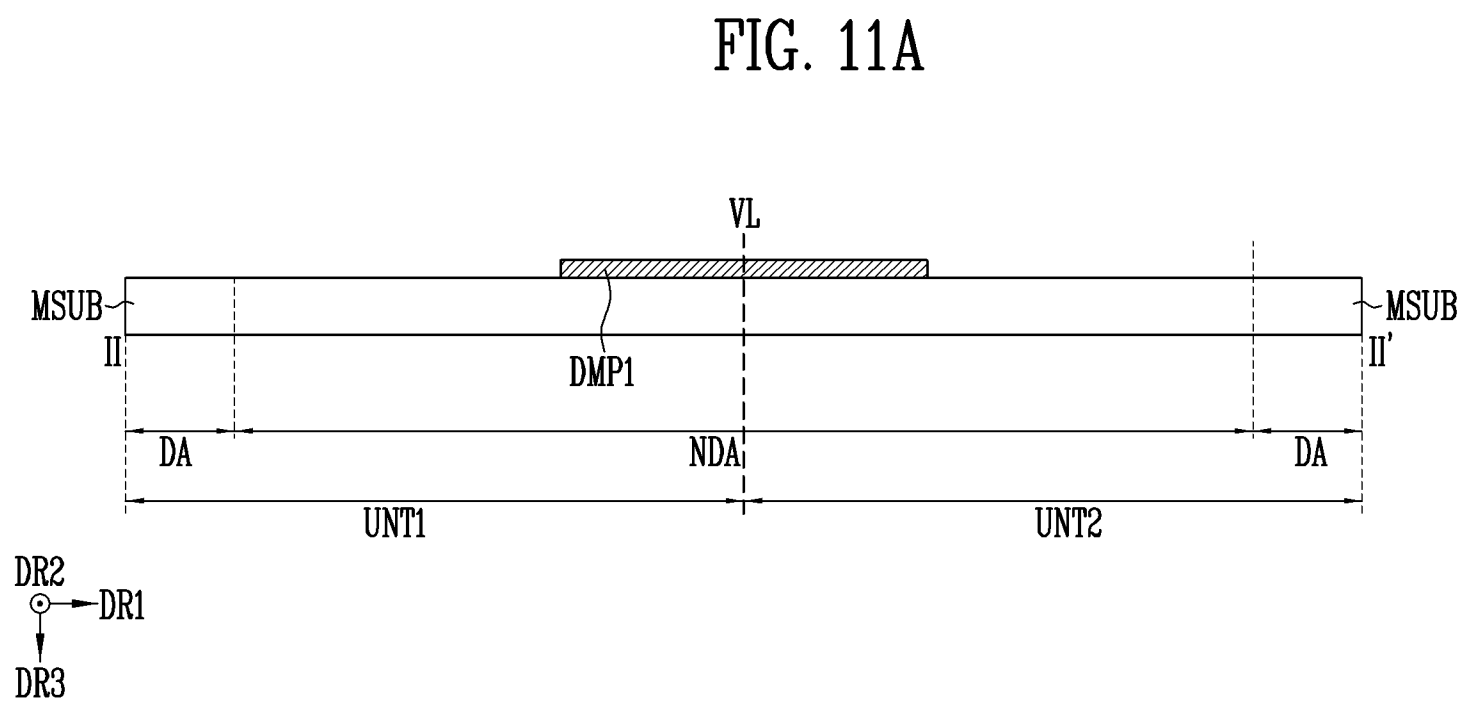
Figure 11B:
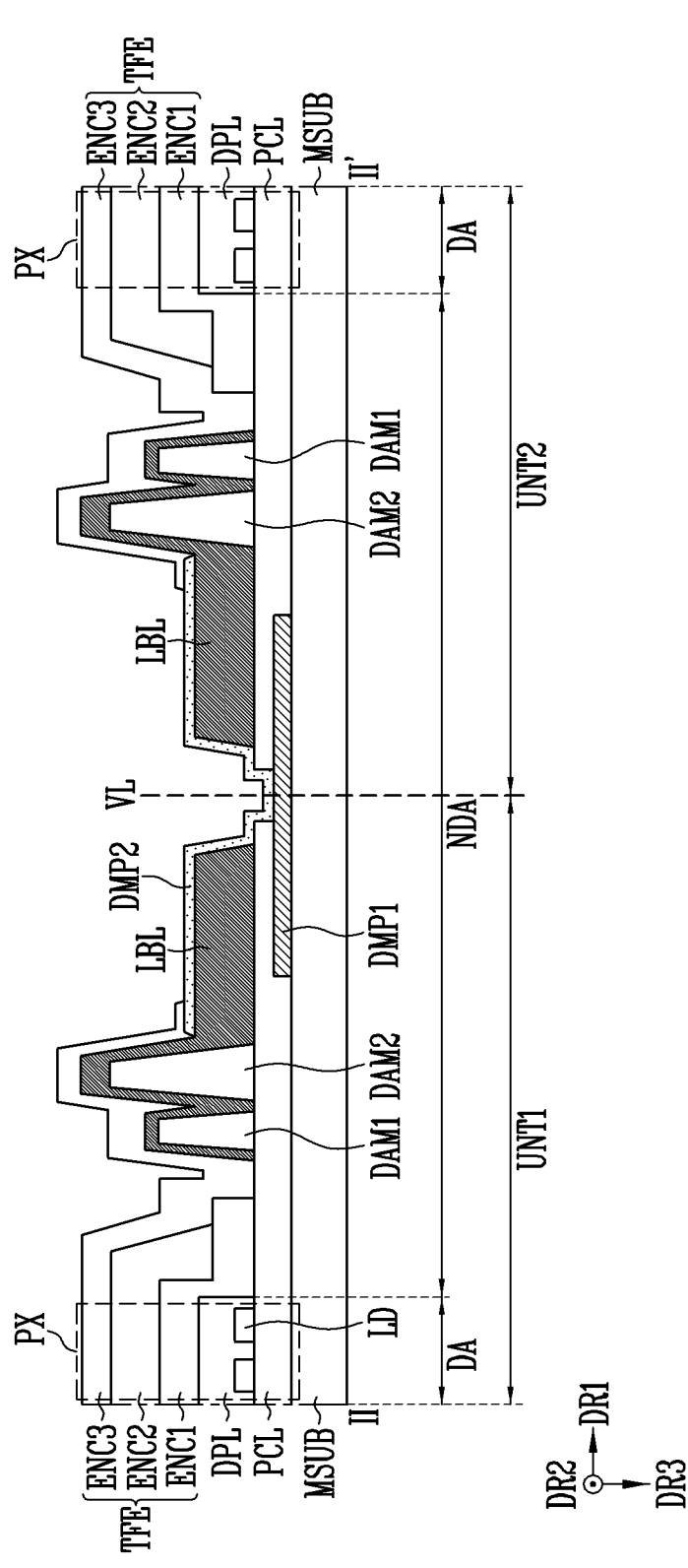
FIG. 11B is a schematic cross-sectional view taken along line II-II' of FIG. 10B.
Figure 11C:
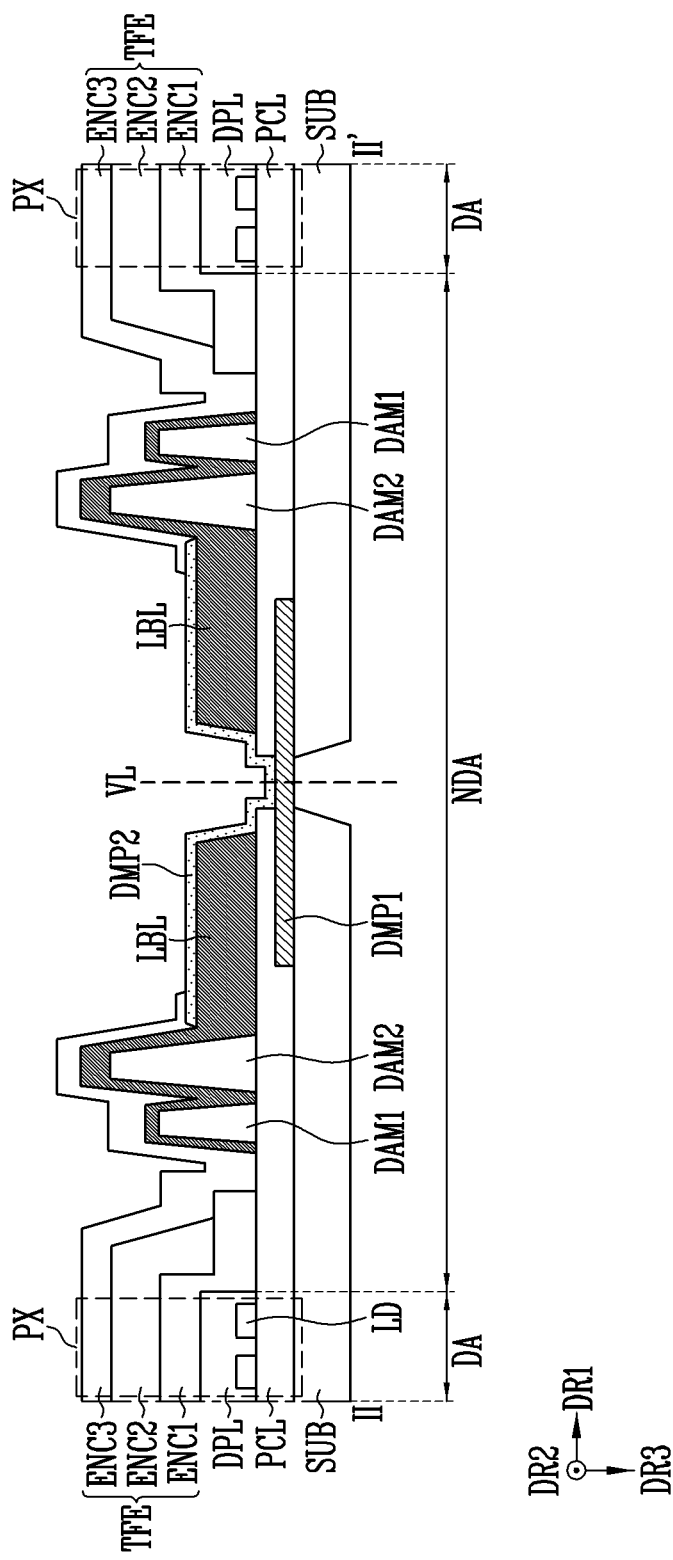
FIG. 11C is a schematic cross-sectional view taken along line II-II' of FIG. 10C.
Figure 11D:
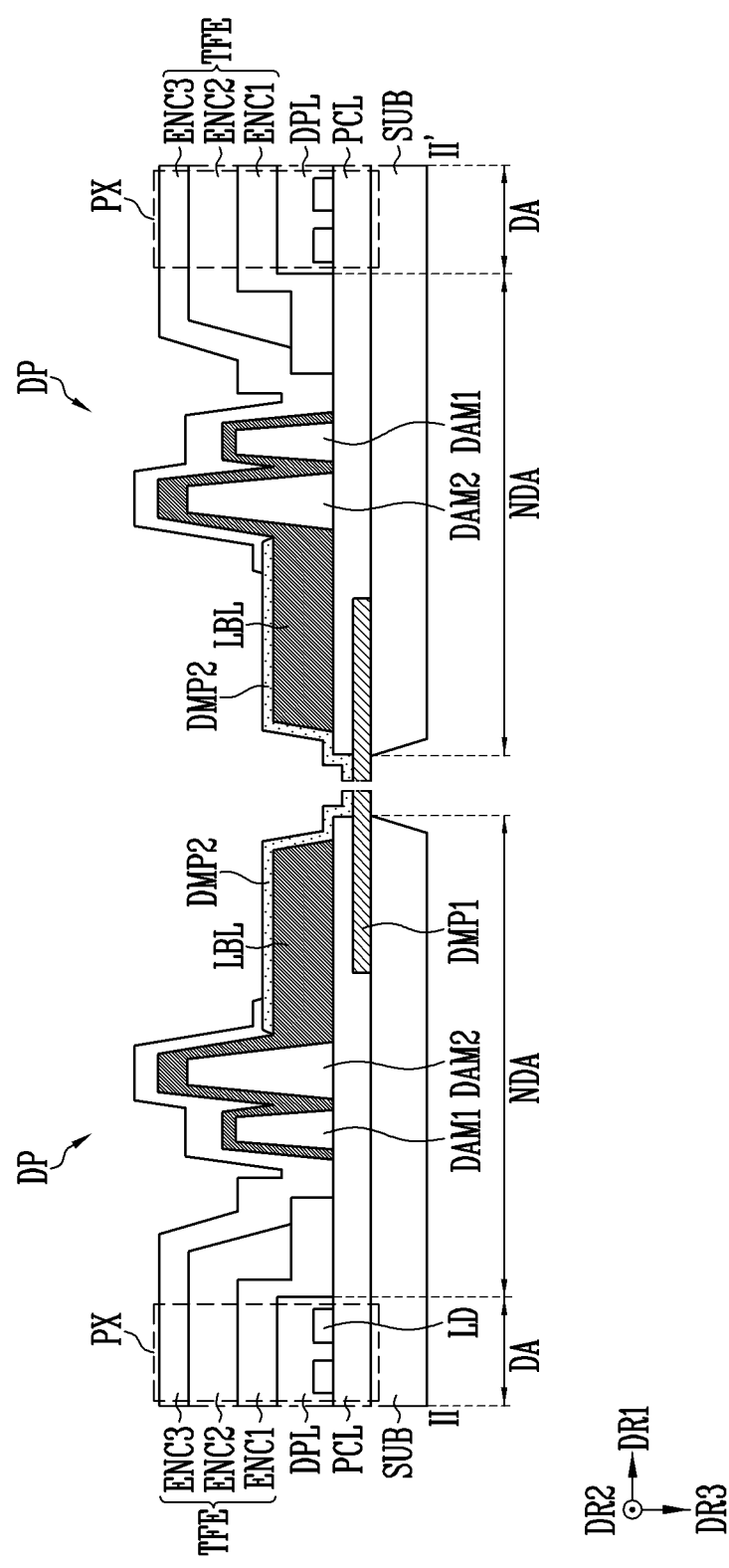
FIG. 11D is a schematic cross-sectional view taken along line II-II' of FIG. 10D.

FIGS. 10A to 10D are schematic plan views sequentially illustrating a method of manufacturing a display device according to an embodiment, FIG. 11A is a schematic cross-sectional view taken along line II-II' of FIG. 10A, FIG. 11B is a schematic cross-sectional view taken along line II-II' of FIG. 10B, FIG. 11C is a schematic cross-sectional view taken along line II-II' of FIG. 10C, and FIG. 11D is a schematic cross-sectional view taken along line II-II' of FIG. 10D.

Hereinafter, the display panel shown in FIGS. 6 and 7 is sequentially described according to a manufacturing method in conjunction with FIGS. 10A to 10D and 11A to 11D.

In the disclosure, it is described that manufacturing steps of the display device are sequentially performed according to a plan view and a cross-sectional view, but it is obvious that some steps shown to be performed consecutively may be performed simultaneously, an order of each step may be changed, some steps may be omitted, or another step may be further included between each step.

Referring to FIGS. 4 to 7, 10A, and 11A, a mother substrate MSUB is prepared. A carrier substrate for supporting the mother substrate MSUB may be disposed on a rear surface of the mother substrate MSUB. The mother substrate MSUB and the carrier substrate may be in contact with each other and may be attached with each other by static electricity or van der Waals force.

The mother substrate MSUB may include at least one or more unit areas UNT1 and UNT2. For example, the mother substrate MSUB may include a first unit area UNT1 and a second unit area UNT2. The unit areas UNT1 and UNT2 may be portions corresponding to an individual display panel DP or an individual display device DD, and the substrate SUB of the individual display panel DP or the individual display device DD may be formed for each of unit areas UNT1 and UNT2.

The first unit area UNT1 and the second unit area UNT2 may have the same size (or area) and may be disposed in a matrix shape in the mother substrate MSUB, but embodiments are not limited thereto. According to an embodiment, the first unit area UNT1 and the second unit area UNT2 may have different sizes (or areas) in the mother substrate MSUB, and may be disposed in various shapes according to a size (or an area) of the mother substrate MSUB. In an embodiment, each of the first unit area UNT1 and the second unit area UNT2 may include the display area DA and the non-display area NDA.

The first unit area UNT1 and the second unit area UNT2 may be divided by a virtual line VL extending in the second direction DR2. The virtual line VL may define (or partition) a unit area UNT1 or UNT2 in a shape surrounding each of the first and second unit areas UNT1 and UNT2. In an embodiment, the virtual line VL may be positioned between the first unit area UNT1 and the second unit area UNT2. Accordingly, at least one side of the first unit area UNT1 may be in contact with the second unit area UNT2 with the virtual line VL interposed therebetween. The mother substrate MSUB may be used to form individual display panels DP along the virtual line VL.

The first unit area UNT1 and the second unit area UNT2 adjacent to each other may contact each other or may be spaced apart from each other. In the drawing, the first unit area UNT1 and the second unit area UNT2 adjacent to each other are in contact with each other with a virtual line VL interposed therebetween, but embodiments are not limited thereto. According to an embodiment, the first unit area UNT1 and the second unit area UNT2 spaced apart from each other may be divided by two or more virtual lines VL.

The first dummy pattern DMP1 is formed on a surface of the above-described mother substrate MSUB. The first dummy pattern DMP1 may be formed by a photo-lithography process by using a mask, and may be positioned in the non-display area NDA of each of the first unit area UNT1 and the second unit area UNT2.

Referring to FIGS. 4 to 7, 10B, and 11B, the pixel unit PX (or the display unit), the driver, the line unit, the dam unit DAM, the light blocking layer LBL, and the second dummy pattern DMP2 are formed on the mother substrate MSUB on which the first dummy pattern DMP1 is disposed. The pixel unit PX (or the display unit) may include pixels PXL in the display area DA in the first and second unit areas UNT1 and UNT2 and the thin film encapsulation layer TFE covering the pixels PXL. The thin film encapsulation layer TFE may be an encapsulation substrate covering the pixels PXL, the driver, the dam unit DAM, the light blocking layer LBL, and the second dummy pattern DMP2. In case that the thin film encapsulation layer TFE is the encapsulation substrate, the mother substrate MSUB may be a lower substrate and the thin film encapsulation layer TFE may be an upper substrate.

Each of the pixels PXL may include the pixel circuit layer PCL on the substrate SUB and the display element layer DPL on the pixel circuit layer PCL. The pixels PXL and the like may be formed by various processes, and for example, may be formed by depositions and/or photo-lithography.

Here, the second dummy pattern DMP2 may be positioned in the non-display area NDA of each of the first and second unit areas UNT1 and UNT2 and may be formed along an edge (or edge portion) of the mother substrate MSUB. For example, the second dummy pattern DMP2 may be formed in the non-display area NDA between the first unit area UNT1 and the second unit area UNT2 based on the virtual line VL. The virtual line VL may be disposed at a position that bisects the second dummy pattern DMP2 positioned in the non-display area NDA between the first unit area UNT1 and the second unit area UNT2 in a plan view and in a cross-sectional view. A side and another side of the second dummy pattern DMP2 bisected by the virtual line VL may be included in the unit areas UNT1 and UNT2 adjacent to each other, respectively. For example, the side of the second dummy pattern DMP2 may be included in the first unit area UNT1, and the other side of the second dummy pattern DMP2 may be included in the second unit area UNT2.

In a plan view and in a cross-sectional view, the second dummy pattern DMP2 may overlap the first dummy pattern DMP1. In an embodiment, the second dummy pattern DMP2 may be formed of a transparent conductive oxide. The second dummy pattern DMP2 and a partial configuration of the pixel unit PX (or the display unit) may be manufactured in the same process. For example, the second dummy pattern DMP2 and the second electrode CE of the display element layer DPL may be manufactured in the same process, and may include the same material. However, embodiments are not limited thereto, and according to an embodiment, the second dummy pattern DMP2 may be formed in a separate step different from that of the configurations of the display element layer DPL.

The second dummy pattern DMP2 may be formed in a shape surrounding a partial configuration positioned in the non-display area NDA of each of the first and second unit areas UNT1 and UNT2. For example, the second dummy pattern DMP2 may be formed in a shape surrounding an end of the pixel circuit layer PCL positioned in the non-display area NDA.

Referring to FIGS. 4 to 7, 10C, and 11C, after removing the carrier substrate positioned on the rear surface of the mother substrate MSUB, a portion of the mother substrate MSUB may be removed by performing a dry etching process by seating the above-described mother substrate MSUB in a vacuum chamber. At this time, the rear surface of the mother substrate MSUB may be an etch object surface, and an area corresponding to the display area DA of each of the first and second unit areas UNT1 and UNT2 may be covered by a mask.

Since the first and second dummy patterns DMP1 and DMP2 are positioned along the edge portion of the mother substrate MSUB, and the second dummy pattern DMP2 surrounds a partial configuration positioned on an upper surface of the mother substrate MSUB, the partial configuration may be prevented from being damaged by an etching gas used in the dry etching process. For example, as the first dummy pattern DMP1 formed of a transparent conductive oxide that is little (or less) affected by the etching gas is positioned directly on the upper surface of the mother substrate MSUB, the mother substrate MSUB may be prevented from being excessively etched by the etching gas.

The substrate SUB from which a portion of the mother substrate MSUB is removed by the etching gas used in the dry etching process may be formed. At this time, the substrate SUB from which a portion is removed by the above-described process may have a side surface having an inverse tapered shape. For example, a width of the substrate SUB may become narrower from the upper surface (refer to 'UF' of FIG. 7) to the rear surface (refer to 'BF' of FIG. 7) along the first direction DR1. The substrate SUB may be a base substrate of each of the first and second unit areas UNT1 and UNT2, and may have the same configuration (or structure) as the substrate SUB described with reference to FIGS. 4 and 7. As described above, as a portion of the mother substrate MSUB is removed, the first and second dummy patterns DMP1 and DMP2 may protrude from the edge end part (refer to 'A' of FIG. 7) of the substrate SUB along the first direction DR1.

Referring to FIGS. 4 to 7, 10D, and 11D, the first and second dummy patterns DMP1 and DMP2 positioned adjacent to the virtual line VL may be separated based on the virtual line (refer to 'VL of FIG. 10C), and thus the individual display panel DP may be formed.

Figure 12:
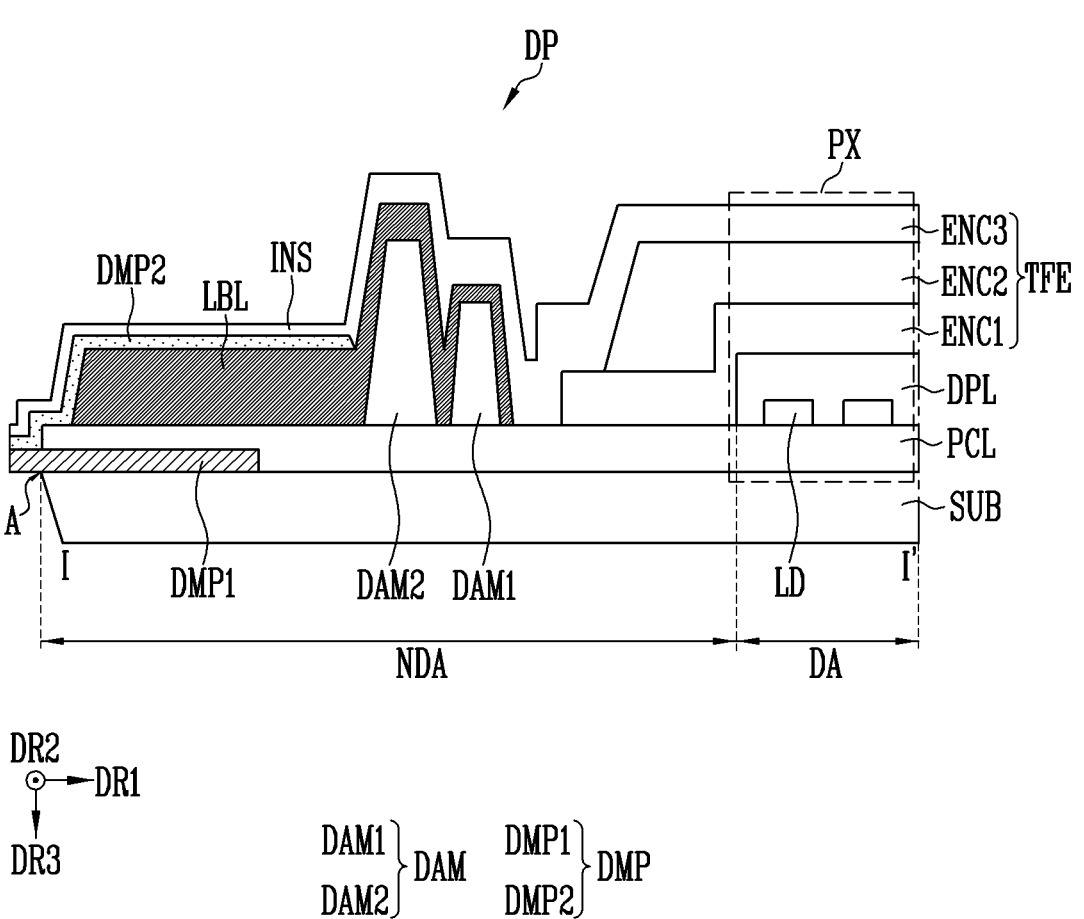
FIG. 12 is a schematic cross-sectional view taken along line I-I' of FIG. 4 as an implementation of a third encapsulation layer shown in FIG. 6 according to an embodiment.

FIG. 12 is a schematic cross-sectional view taken along line I-I' of FIG. 4 as an implementation of the third encapsulation layer shown in FIG. 6 according to an embodiment, and FIG. 13 is a schematic cross-sectional view taken along line I-I' of FIG. 4, which illustrates another example of the display panel shown in FIG. 12.

Regarding the display panel of FIGS. 12 and 13, a point different from that of the above-described embodiment is described in order to avoid a redundant description. Parts which are not specifically described in the disclosure are in accordance with the above-described embodiment, and the same reference numerals indicate the same components and similar reference numerals indicate similar components.

Referring to FIGS. 1 to 4, 12, and 13, the display panel DP may include the substrate SUB, the pixel unit PX (or the display unit), the thin film encapsulation layer TFE, the dummy unit DMP, and the dam unit DAM. The pixel unit PX (or the display unit) may include the pixels PXL in the display area DA and the thin film encapsulation layer TFE covering the pixels PXL. The pixel unit PX (or the display unit) may include the pixel circuit layer PCL on the substrate SUB, the display element layer DPL on the pixel circuit layer PCL, and the thin film encapsulation layer TFE on the display element layer DPL.

In an embodiment, the display element layer DPL may include at least one light emitting element LD formed as an organic light emitting diode. According to an embodiment, the display element layer DPL may include at least one light emitting element LD formed of an inorganic light emitting diode as small as a micro-scale or a nano-scale formed in a structure in which a nitride-based semiconductor is grown as shown in FIGS. 5B and 8. The display element layer DPL may further include the first and second bank patterns (refer to 'BNK1' and 'BNK2' of FIG. 8), the first and second alignment electrodes (refer to 'EL1' and 'EL2' of FIG. 8), the first and second insulating layers (refer to 'INS1' and 'INS2' of FIG. 8) and the first and second contact electrodes (refer to 'CNE1' and 'CNE2' of FIG. 8).

The dummy unit DMP may include the first dummy pattern DMP1 and the second dummy pattern DMP2 in the non-display area NDA. The first dummy pattern DMP1 may be disposed on the surface UF (e.g., the upper surface) of the substrate SUB, and may protrude from the edge end part A of the substrate SUB in a direction away from the pixel unit PX (or the display unit) along the first direction DR1. The second dummy pattern DMP2 may be disposed on the light blocking layer LBL and may cover side surfaces of some components positioned on the upper surface of the substrate SUB. Similarly to the first dummy pattern DMP1, the second dummy pattern DMP2 may protrude from the edge end part A of the substrate SUB in a direction away from the pixel unit PX (or the display unit) along the first direction DR1.

An insulating layer INS may be disposed and/or formed on the second dummy pattern DMP2. The insulating layer INS may prevent the second dummy pattern DMP2 formed of a transparent conductive oxide from being exposed to the outside to protect the second dummy pattern DMP2. The insulating layer INS may be an inorganic insulating layer including an inorganic material. The insulating layer INS may include at least one of a metal oxide such as silicon nitride ($SiN_x$), silicon oxide ($SiO_x$), silicon oxynitride (SiON), or aluminum oxide ($AlO_x$). In an embodiment, the insulating layer INS may be integral with a partial configuration of the thin film encapsulation layer TFE. For example, the insulating layer INS may be formed of an inorganic layer in the thin film encapsulation layer TFE and may be integral with the third encapsulation layer ENC3 corresponding to the uppermost layer (or outermost layer) of the display panel DP. However, embodiments are not limited thereto, and according to an embodiment, in case that the first encapsulation layer ENC1 formed of an inorganic layer in the thin film encapsulation layer TFE is extended up to the edge end part A of the substrate SUB, the insulating layer INS may be integral with the first encapsulation layer ENC1.

In the above-described embodiment, the insulating layer INS disposed on the second dummy pattern DMP2 is integral with a partial configuration of the thin film encapsulation layer TFE, but embodiments are not limited thereto. According to an embodiment, the insulating layer INS may not be integral with the thin film encapsulation layer TFE.

Figure 14:
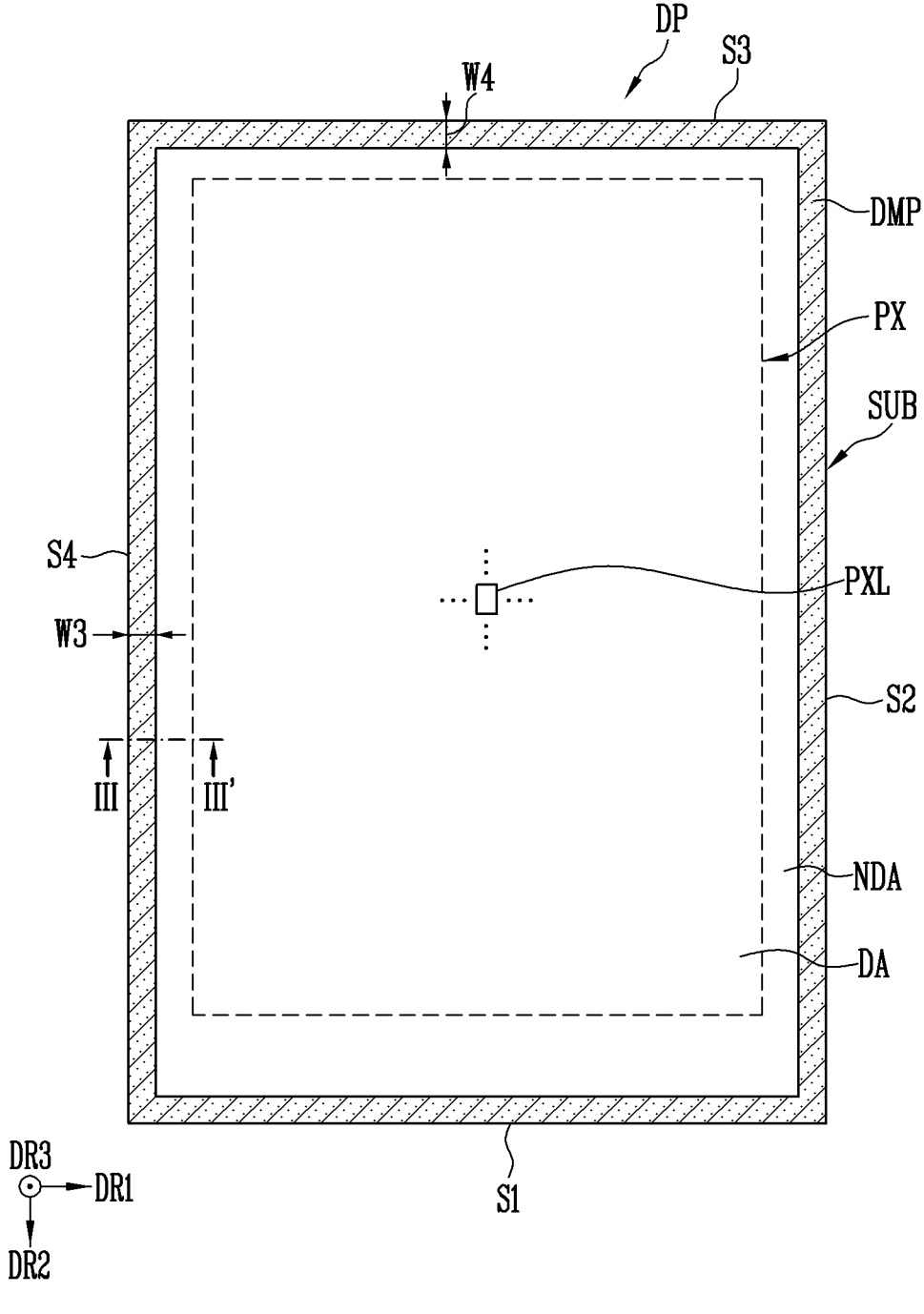
FIG. 14 is a schematic plan view illustrating the display panel shown in FIG. 4 according to an embodiment.
Figure 15:
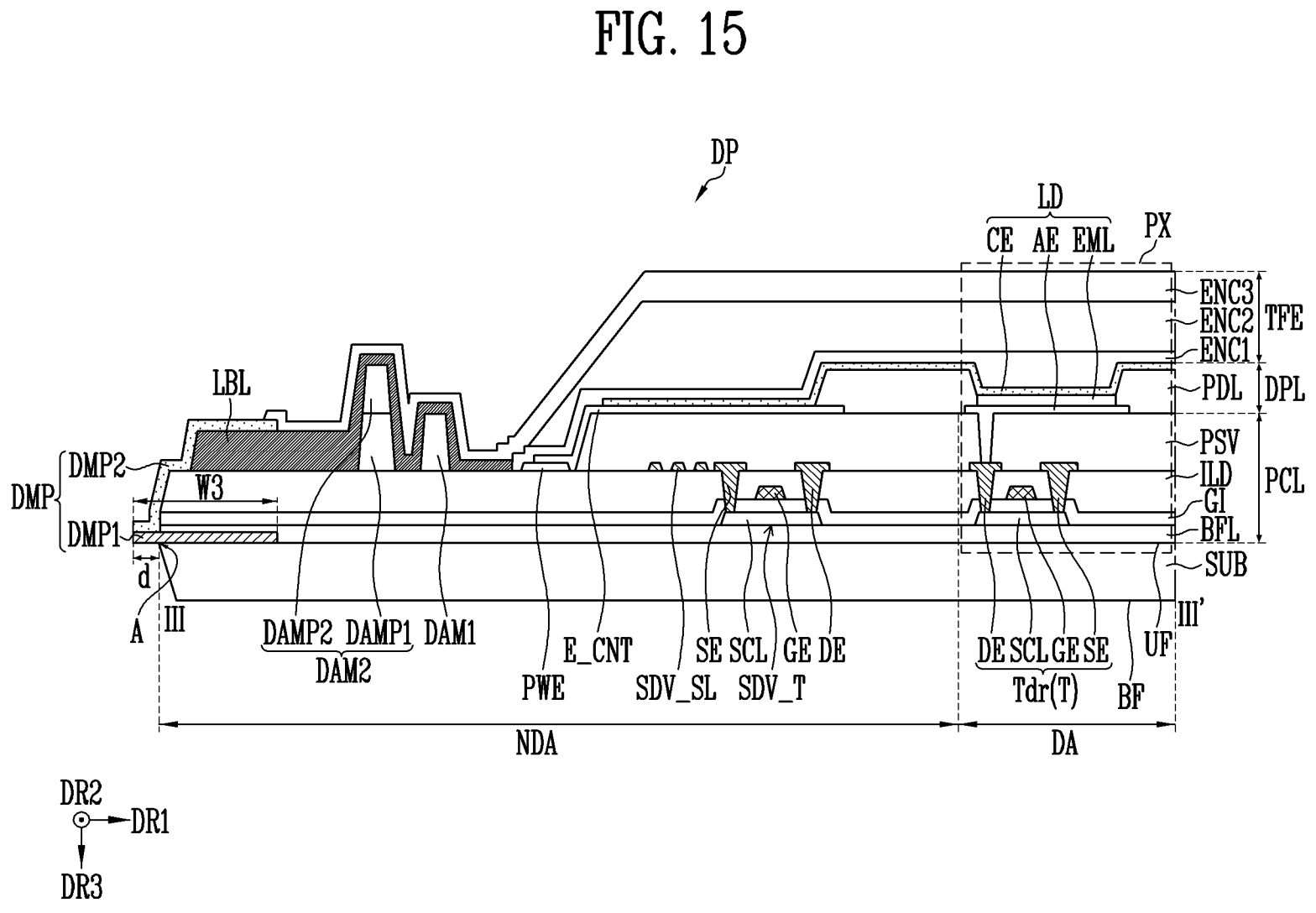

FIG. 14 is a schematic plan view illustrating the display panel shown in FIG. 4 according to an embodiment, and FIG. 15 is a schematic cross-sectional view taken along line III-III' of FIG. 14.

Regarding the display panel of FIGS. 14 and 15, a point different from that of the above-described embodiment is described in order to avoid a redundant description.

Referring to FIGS. 1 to 3, 14, and 15, the display panel DP may include the dummy unit DMP positioned along the edge portion of the substrate SUB. The dummy unit DMP may be positioned in the non-display area NDA of the substrate SUB. The dummy unit DMP may have a shape forming a closed circuit along the edge portion of the substrate SUB in a plan view.

The dummy unit DMP may include the first dummy pattern DMP1 and the second dummy pattern DMP2. The first dummy pattern DMP1 and the second dummy pattern DMP2 may have the substantially same planar shape and overlap each other. A width W3 of the first dummy pattern DMP1 in the first direction DR1 and a width W3 of the second dummy pattern DMP2 in the first direction DR1 may be substantially identical to each other. For example, a width W4 of the first dummy pattern DMP1 in the second direction DR2 and a width W4 of the second dummy pattern DMP2 in the second direction DR2 may be substantially identical to each other. The width W3 of each of the first and second dummy patterns DMP1 and DMP2 in the first direction DR1 and the width W4 of each of the first and second dummy patterns DMP1 and DMP2 in the second direction DR2 may be substantially identical to each other, but embodiments are not limited thereto. According to an embodiment, the width W3 of each of the first and second dummy patterns DMP1 and DMP2 in the first direction DR1 may be greater than (or wider than) the width W4 of each of the first and second dummy patterns DMP1 and DMP2 in the second direction DR2 or vice versa.

The above-described display device DD may include a touch sensor between the display panel DP and the window WD. Hereinafter, the display device DD including the touch sensor is described.

Figure 16:
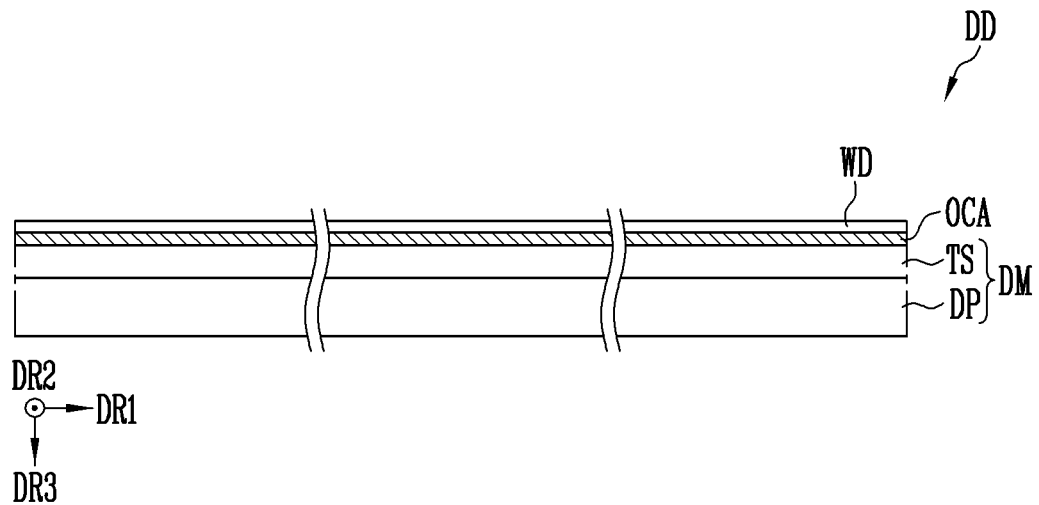
FIG. 16 is a schematic cross-sectional view illustrating the display device of FIG. 1 according to an embodiment.
Figure 17:
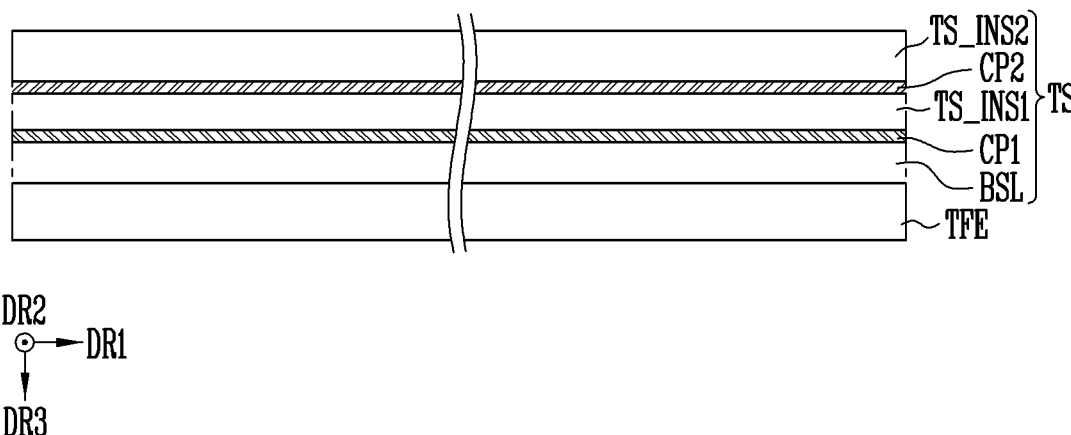
FIG. 17 is a schematic cross-sectional view of a touch sensor of FIG. 16.

FIG. 16 is a schematic cross-sectional view illustrating the display device of FIG. 1 according to an embodiment, and FIG. 17 is a schematic cross-sectional view of the touch sensor of FIG. 16.

Regarding the display device of FIGS. 16 and 17, a point different from that of the above-described embodiment is described in order to avoid a redundant description. Parts which are not specifically described in the disclosure are in accordance with the above-described embodiment, and the same reference numerals indicate the same components and similar reference numerals indicate similar components.

Referring to FIGS. 1, 16, and 17, the display device DD may include a display module DM and the window WD. The display module DM may include the display panel DP and the touch sensor TS. The display panel DP may have the same configuration (or structure) as the display panel DP described with reference to FIGS. 2 to 7. The window WD may have the same configuration as the window WD described with reference to FIG. 2, and may be coupled to the display module DM by using an optically transparent viscosity member OCA (or an adhesive layer).

The touch sensor TS may be disposed (e.g., directly disposed) on a surface on which an image of the display panel DP is emitted to receive a user's touch input and/or a hover input. The touch sensor TS may sense a touch capacitance by contact and/or proximity of a separate input part (or mean) such as a user's hand or a conductor similar thereto to recognize the touch input and/or the hover input of the display device DD. Here, the touch input may mean a direct touch (or contact) by a user's hand or a separate input part (e.g., mean), and the hover input may mean that a user's hand or a separate input part (e.g., mean) is near the display device DD including the touch sensor TS but does not touch the display device DD. For example, the touch sensor TS may sense a user's touch operation and move an object displayed on the display device DD from an originally displayed position to another position in response to the touch operation. Here, the touch operation may include at least one touch among a single touch, a multi-touch, and a touch gesture. For example, various touch operations including a specific gesture such as enlarging or reducing text or an image by moving a distance (e.g., a predetermined distance) in a state in which a user's finger touches on a touch surface of the touch sensor TS may exist.

The touch sensor TS may have a multiple layer structure. The touch sensor TS may include at least one or more conductive layers and may include at least one or more insulating layers.

The touch sensor TS may include a base layer BSL, a first conductive pattern CP1 (e.g., a first conductive part), a first touch insulating layer TS_INS1, a second conductive pattern CP2 (e.g., a second conductive part), and a second touch insulating layer TS_INS2.

The first conductive pattern CP1 may be disposed (e.g., directly disposed) on the thin film encapsulation layer TFE of the display panel DP, but embodiments are not limited thereto. According to an embodiment, another insulating layer, for example, the base layer BSL, may be disposed between the first conductive pattern CP1 and the thin film encapsulation layer TFE. The first conductive pattern CP1 may be disposed (e.g., directly disposed) on the base layer BSL.

Each of the first and second conductive patterns CP1 and CP2 may have a single layer structure or may have a multiple layer structure stacked in a thickness direction, for example, the third direction DR3. The conductive pattern of the single layer structure may include a metal layer or a transparent conductive layer. The metal layer may include molybdenum (Mo), silver (Ag), titanium (Ti), copper (Cu), aluminum (Al), and an alloy thereof. The transparent conductive layer may transparent conductive oxide such as include indium tin oxide (ITO), indium zinc oxide (IZO), zinc oxide (ZnO), or indium tin zinc oxide (ITZO). For example, the transparent conductive layer may include PEDOT, a metal nanowire, and graphene.

The conductive pattern of the multiple layer structure may include metal layers as multiple layers. The metal layers (as multiple layers) may have, for example, a triple structure of titanium (Ti)/aluminum (Al)/titanium (Ti), but embodiments are not limited thereto. The conductive pattern of the multiple layer structure may include metal layers (as multiple layers) and a transparent conductive layer.

In an embodiment, each of the first and second conductive patterns CP1 and CP2 may include sensor patterns and sensing lines.

Each of the first and second touch insulating layers TS_INS1 and TS_INS2 may include an inorganic insulating layer including an inorganic material or an organic insulating layer including an organic material. The inorganic insulating layer may include at least one of a metal oxide such as silicon nitride ($SiN_x$), silicon oxide ($SiO_x$), silicon oxynitride (SiON), and aluminum oxide ($AlO_x$). The organic insulating layer may include at least one of acrylic resin, methacrylic resin, polyisoprene, vinyl-based resin, epoxy-based resin, urethane-based resin, cellulose-based resin, siloxane-based resin, polyimide-based resin, polyamide-based resin, and perylene-based resin.

Figure 18:
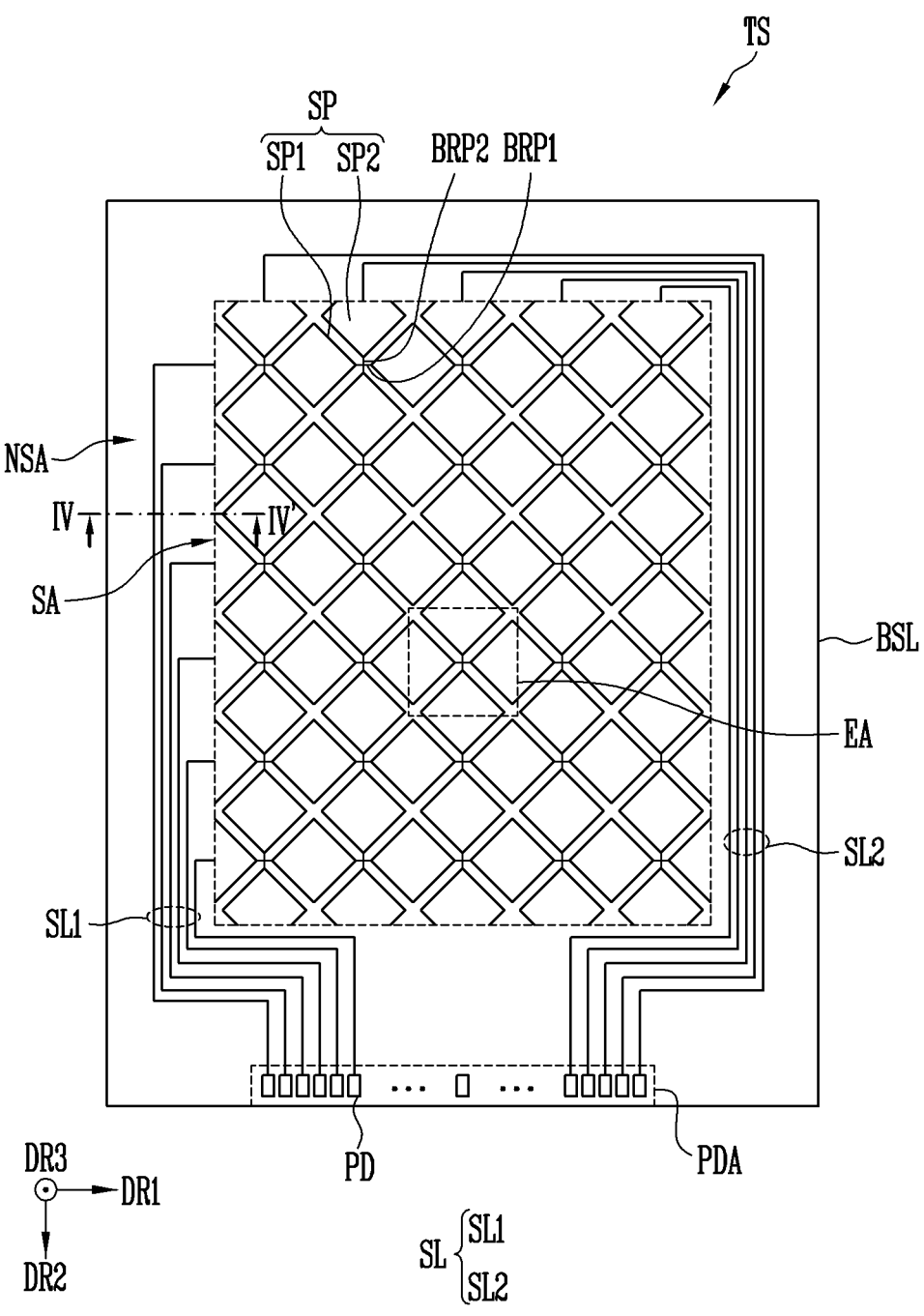
FIG. 18 is a schematic plan view of the touch sensor of FIG. 16.
Figure 19A:
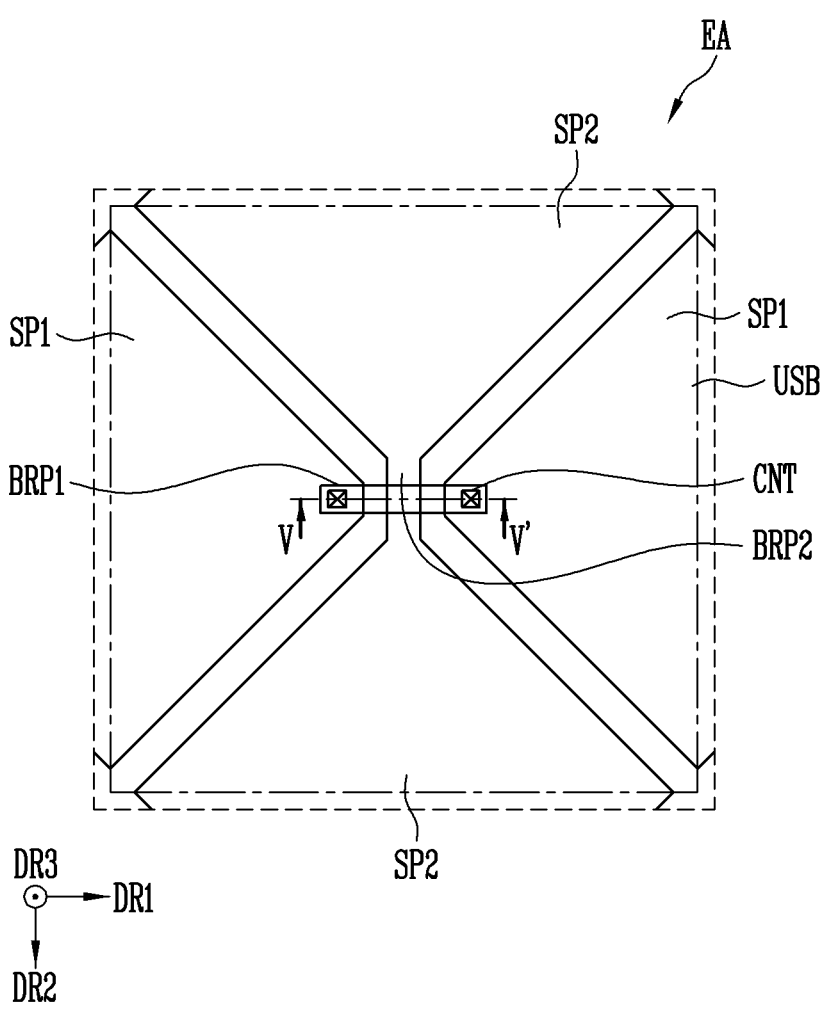
FIG. 19A is a schematic enlarged plan view schematically illustrating an example of a portion EA of FIG. 18.
Figure 19B:
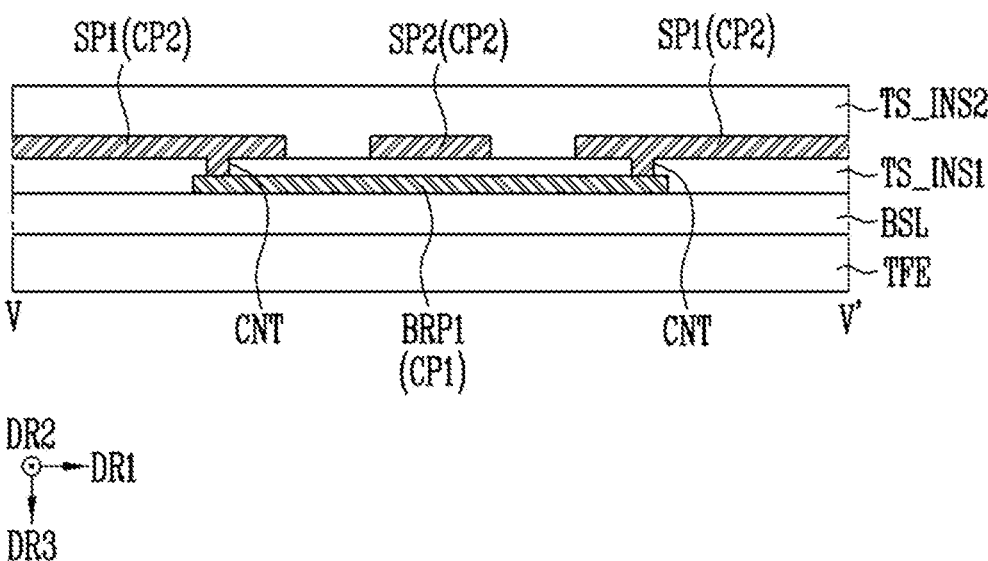
FIG. 19B is a schematic cross-sectional view taken along line V-V' of FIG. 19A.

FIG. 18 is a schematic plan view of the touch sensor of FIG. 16, FIG. 19A is a schematic enlarged plan view schematically illustrating an example of a portion EA of FIG. 18, and FIG. 19B is a schematic cross-sectional view taken along line V-V' of FIG. 19A.

Referring to FIGS. 1 and 16 to 19B, the touch sensor TS may include a base layer BSL including a sensing area SA capable of sensing a touch input and a non-sensing area NSA surrounding at least a portion of the sensing area SA.

The base layer BSL may be formed of tempered glass, transparent plastic, or a transparent film. According to an embodiment, the base layer BSL may be omitted.

The sensing area SA may be disposed in a central area of the base layer BSL to overlap the display area DA of the display panel DP. The sensing area SA and the display area DA may have a substantially same shape, but embodiments are not limited thereto. A sensor electrode for sensing the touch input may be disposed and/or formed in the sensing area SA.

The non-sensing area NSA may be disposed in a peripheral area of the base layer BSL to overlap the non-display area NDA of the display panel DP. Here, the peripheral area may be an area surrounding the central area of the base layer BSL. Sensing lines SL electrically connected to the sensor electrode to receive and transmit a sensing signal are disposed and/or formed in the non-sensing area NSA. For example, a pad unit PDA connected to the sensing lines SL and electrically connected to the sensor electrode of the sensing area SA may be disposed in the non-sensing area NSA. The pad unit PDA may include pads PD. The sensing line SL may include first sensing lines SL1 and second sensing lines SL2.

The sensor electrode may include sensor patterns SP and first and second bridge patterns BRP1 and BRP2.

The sensor patterns SP may include first sensor patterns SP1 and second sensor patterns SP2 electrically insulated from the first sensor patterns SP1.

The first sensor patterns SP1 may be arranged in the first direction DR1 and may be electrically connected to the adjacent first sensor patterns SP1 by the first bridge patterns BRP1 to form at least one sensor row. The second sensor patterns SP2 may be arranged in the second direction DR2 crossing the first direction DR1 and may be electrically connected to the adjacent second sensor patterns SP2 through the second bridge patterns BRP2 to form at least one sensor column.

Each of the first and second sensor patterns SP1 and SP2 may be electrically connected to a pad PD through a corresponding sensing line SL. For example, each of the first sensor patterns SP1 may be electrically connected to a pad PD through each first sensing line SL1, and each of the second sensor patterns SP2 may be electrically connected to a pad PD through each second sensing lines SL2.

The above-described first sensor patterns SP1 may be a driving electrode that receives a driving signal for detecting a touch position within the sensing area SA, and the second sensor patterns SP2 may be a sensing electrode that outputs a sensing signal for detecting the touch position within the sensing area SA. However, embodiments are not limited thereto, and the first sensor patterns SP1 may be the sensing electrode, and the second sensor patterns SP2 may be the driving electrode.

In an embodiment, the touch sensor TS may recognize a user's touch by sensing a change amount of a mutual capacitance formed between the first and second sensor patterns SP1 and SP2.

In an embodiment, each of the first and second sensor patterns SP1 and SP2 may have a mesh structure including conductive thin lines.

Each of the first bridge patterns BRP1 is for electrically connecting the first sensor patterns SP1 arranged in parallel along the first direction DR1, and each of the first bridge patterns BRP1 may also have a form extending along the first direction DR1.

Each of the second bridge patterns BRP2 may be for electrically connecting the second sensor patterns SP2 arranged in parallel along the second direction DR2, and each of the second bridge patterns BRP2 may also have a form extending along the second direction DR2. In an embodiment, each of the second bridge patterns BRP2 may be integral with the second sensor patterns SP2. In case that each of the second bridge patterns BRP2 is integral with the second sensor patterns SP2, the second bridge patterns BRP2 may be another example of the second sensor patterns SP2.

The touch sensor TS may include the first conductive pattern CP1 on the base layer BSL, the first touch insulating layer TS_INS1 on the first conductive pattern CP1, the second conductive pattern CP2 on the first touch insulating layer TS_INS1, and the second touch insulating layer TS_INS2 on the second conductive pattern CP2.

The first bridge patterns BRP1 disposed in the sensing area SA may be included in the first conductive pattern CP1, and the first and second sensor patterns SP1 and SP2 and the second bridge patterns BRP2 may be included in the second conductive pattern CP2. For example, a portion of the sensing lines SL disposed in the non-sensing area NSA may be included in the first conductive pattern CP1, and the other portion of the sensing lines SL may be included in the second conductive pattern CP2. The first sensor patterns SP1 adjacent in the first direction DR1 may be electrically and/or physically connected to each other by the first bridge patterns BRP1 and a contact hole CNT passing through the first touch insulating layer TS_INS1.

In the above-described embodiment, an example in which the first bridge patterns BRP1 are included in the first conductive pattern CP1, and the first and second sensor patterns SP1 and SP2 and the second bridge patterns BRP2 are included in the second conductive pattern CP2 is described, but embodiments are not limited thereto. According to an embodiment, the first and second sensor patterns SP1 and SP2 and the second bridge patterns BRP2 may be included in the first conductive pattern CP1, and the first bridge patterns BRP1 may be included in the second conductive pattern CP2.

For example, in the above-described embodiment, an example in which the first conductive pattern CP1 is disposed on the base layer BSL and the second conductive pattern CP2 is disposed on the first touch insulating layer TS_INS1 is described, but embodiments are not limited thereto. According to an embodiment, the first conductive pattern CP1 may be disposed on the first touch insulating layer TS_INS1, and the second conductive pattern CP2 may be disposed on the base layer BSL.

For example, in the above-described embodiment, an example in which the first and second sensor patterns SP1 and SP2 are disposed on the same layer is described, but embodiments are not limited thereto. According to an embodiment, the first sensor patterns SP1 and the second sensor patterns SP2 may be disposed on different layers.

The sensor electrode disposed and/or formed in the sensing area SA may include dummy sensing electrodes disposed to be spaced apart from each other between the first and second sensor patterns SP1 and SP2. The dummy sensing electrodes may be floating electrodes and may not be electrically connected to the first sensor patterns SP1 and the second sensor patterns SP2. Since the dummy sensing electrodes are disposed in the sensing area SA, a boundary area between the first sensor patterns SP1 and the second sensor patterns SP2 may not be visually recognized. For example, a fringe effect between the first sensor patterns SP1 and the second sensor patterns SP2 may be controlled through an adjustment of a width and a thickness of the dummy sensing electrodes, a capacitance between the first sensor patterns SP1 and the second sensor patterns SP2 may be optimized.

As shown in FIGS. 18 and 19A, the touch sensor TS may be formed in a redundant arrangement of a unit sensor block USB. The unit sensor block USB may be a virtual unit block having an area (e.g., a predetermined area) including at least a portion of the sensor patterns SP neighboring in the first direction DR1 and the sensor patterns SP neighboring in the second direction DR2 within a corresponding sensing area SA. Such a unit sensor block USB may be understood to correspond to a minimum repetitive unit of an arrangement of the sensor patterns SP in the corresponding sensing area SA.

Each of the first sensing lines SL1 may be connected to a sensor row formed by first sensor patterns SP1 disposed along the first direction DR1. Each of the second sensing lines SL2 may be connected to a sensor column formed by second sensor patterns SP2 disposed along the second direction DR2.

Figure 20:
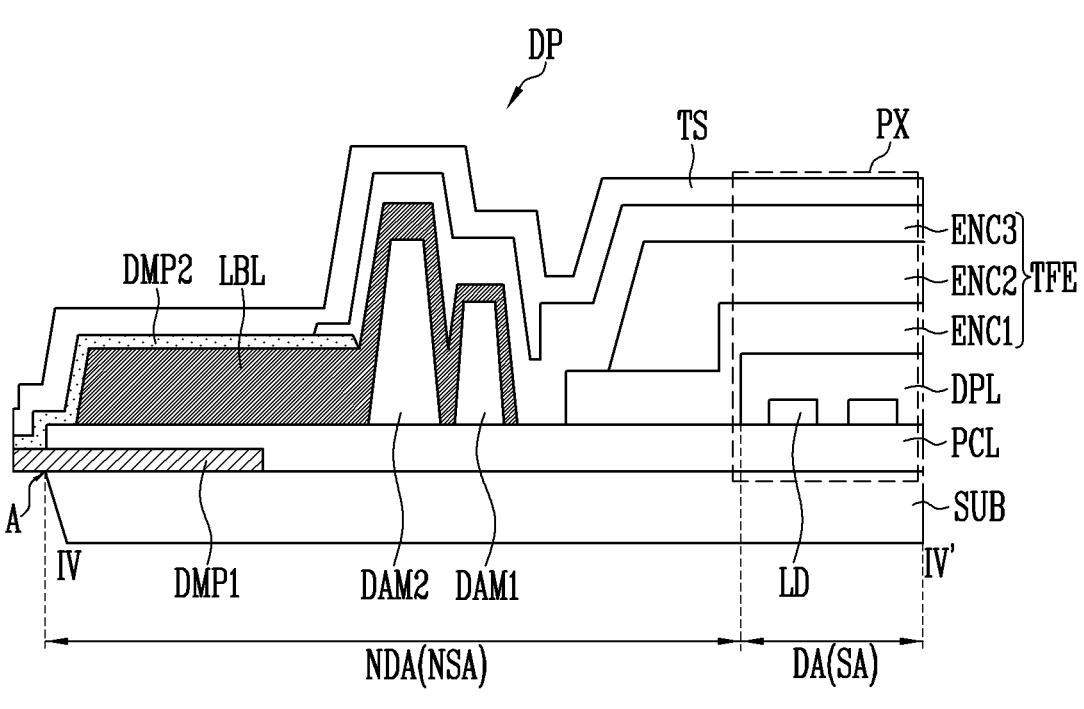
FIG. 20 is a schematic cross-sectional view taken along line IV-IV' of FIG. 18.
Figure 20:
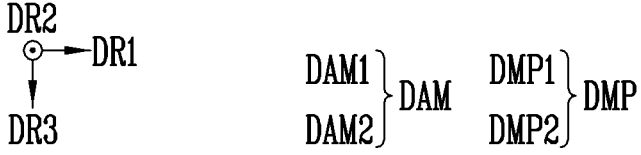
Figure 21:
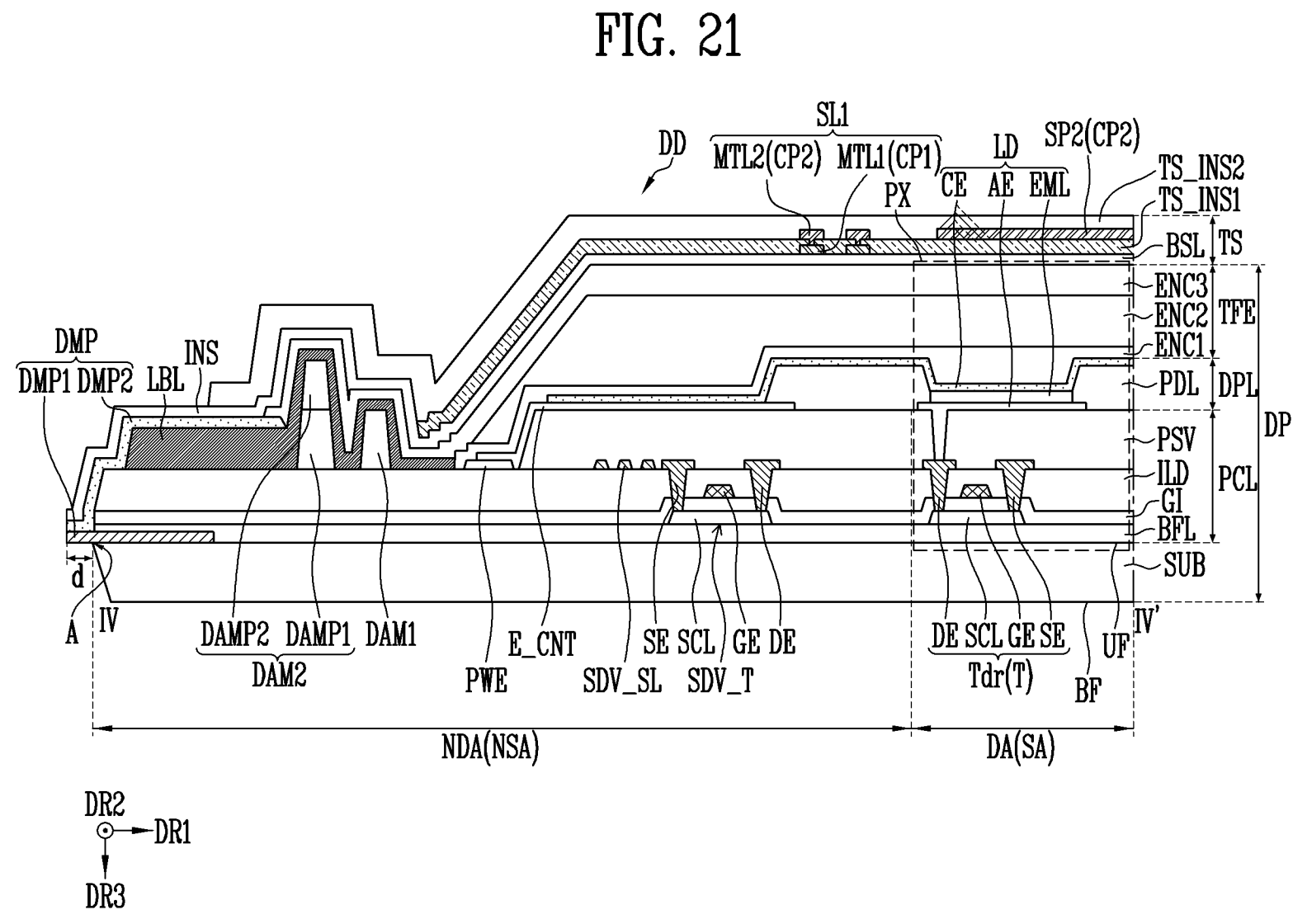
Figure 22:
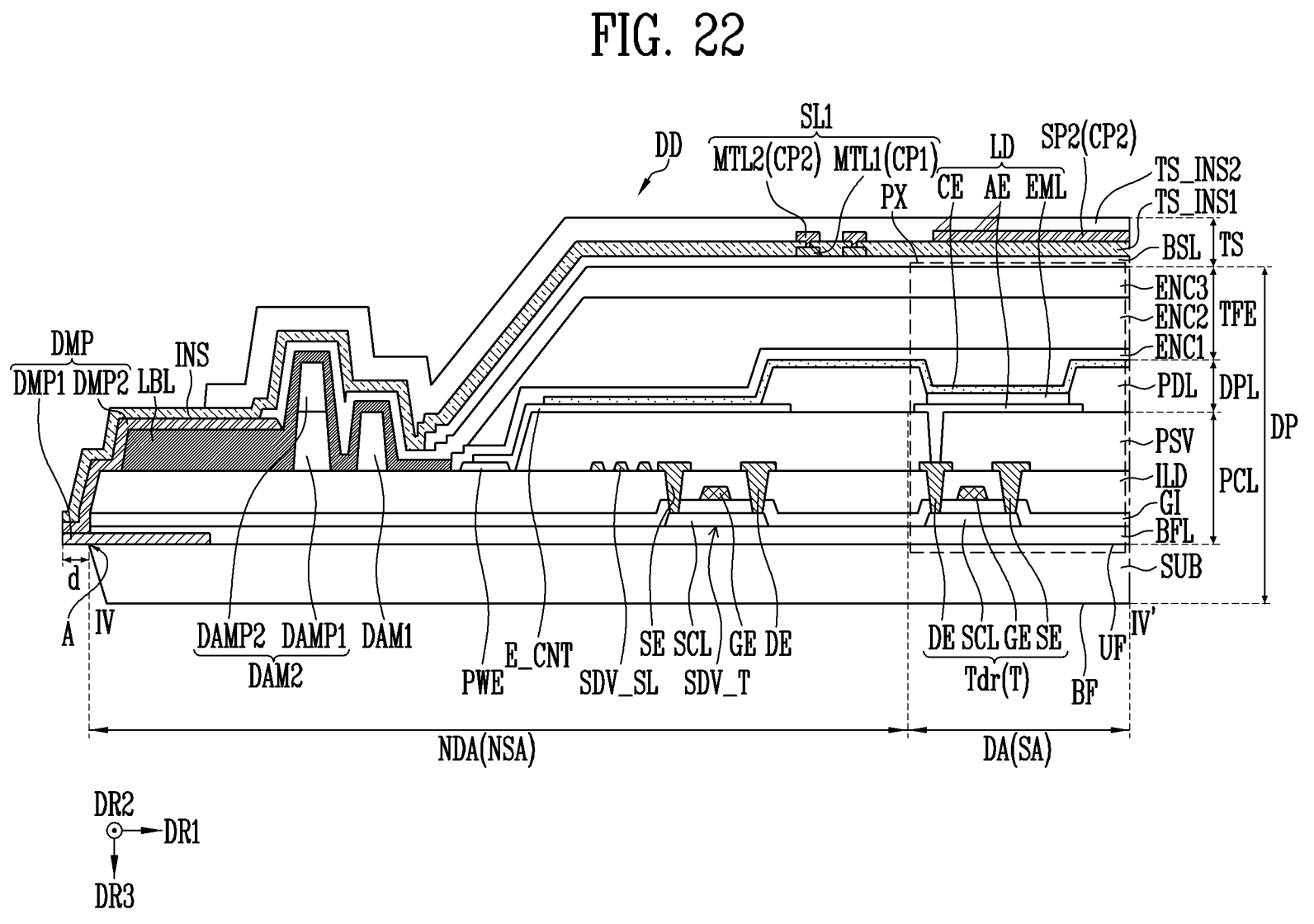

FIG. 20 is a schematic cross-sectional view taken along line IV-IV' of FIG. 18, FIG. 21 is a schematic cross-sectional view taken along line IV-IV' of FIG. 18, which illustrates an area of the display device shown in FIG. 20, and FIG. 22 is a schematic cross-sectional view taken along line IV-IV' of FIG. 18, which illustrates a second dummy pattern and an insulating layer of FIG. 21 according to an embodiment.

Regarding the display device of FIGS. 20 to 22, a point different from that of the above-described embodiment is described in order to avoid a redundant description. Parts which are not specifically described in the disclosure are in accordance with the above-described embodiment, and the same reference numerals indicate the same components and similar reference numerals indicate similar components.

Referring to FIGS. 1 and 16 to 22, the display device DD may include the display panel DP and the touch sensor TS.

The display panel DP may include the substrate SUB, the pixel unit PX (or the display unit), the thin film encapsulation layer TFE, the dummy unit DMP, the light blocking layer LBL, and the dam unit DAM. The pixel unit PX (or the display unit) may include the pixels PXL in the display area DA and the thin film encapsulation layer TFE covering the pixels PXL.

The touch sensor TS may include the base layer BSL, the sensor electrode, the sensing line SL, the first touch insulating layer TS_INS1, and the second touch insulating layer TS_INS2. The sensor electrode may include first bridge patterns BRP1 included in the first conductive pattern CP1, and sensor patterns SP and second bridge patterns BRP2 included in the second conductive pattern CP2. Here, the sensor patterns SP may include first sensor patterns SP1 and second sensor patterns SP2 which are electrically insulated. The sensing lines SL may include a first metal layer MTL1 included in the first conductive pattern CP1 and a second metal layer MTL2 included in the second conductive pattern CP2. The first metal layer MTL1 and the second metal layer MTL2 may be electrically connected to each other through a contact hole passing through the first touch insulating layer TS_INS1.

The dummy unit DMP may include the first dummy pattern DMP1 and the second dummy pattern DMP2 in the non-display area NDA. The second dummy pattern DMP2 may be disposed on the light blocking layer LBL and may cover side surfaces of some configurations positioned on the upper surface of the substrate SUB.

The insulating layer INS may be disposed and/or formed on the second dummy pattern DMP2. The insulating layer INS may be an inorganic insulating layer including an inorganic material. The insulating layer INS may be integral with the base layer BSL included in the touch sensor TS, or may be formed of an inorganic layer in the thin film encapsulation layer TFE and may be integral with the third encapsulation layer ENC3 corresponding to an uppermost layer (or an outermost layer) of the display panel DP. The second dummy pattern DMP2 and a partial configuration of the display element layer DPL may be formed in the same process. For example, in case that the first electrode AE included in the display element layer DPL is a transmissive electrode formed of a transparent conductive oxide, the second dummy pattern DMP2 and the first electrode AE may be formed in the same process. For example, in case that the second electrode CE included in the display element layer DPL is a transmissive electrode formed of a transparent conductive oxide, the second dummy pattern DMP2 and the second electrode CE may be formed in the same process.

In the above-described embodiment, the insulating layer INS is integral with a partial configuration of the thin film encapsulation layer TFE, for example, the third encapsulation layer ENC3 or is integral with the base layer BSL which is a partial configuration of the touch sensor TS, but embodiments are not limited thereto. According to an embodiment, the insulating layer INS may be integral with another insulating layer included in the touch sensor TS. For example, the insulating layer INS may be integral with the first touch insulating layer TS_INS1 as shown in FIG. 22. The second dummy pattern DMP2 and a partial configuration of the touch sensor TS may be formed in the same process. For example, the second dummy pattern DMP2 and the second metal layer MTL2 of each sensing line SL and each second sensor pattern SP2 may be formed in the same process.

In the drawing, the second touch insulating layer TS_INS2 does not cover a portion of the insulating layer INS, but embodiments are not limited thereto. According to an embodiment, the second touch insulating layer TS_INS2 may entirely (or partially) cover the insulating layer INS.

According to the embodiment, a display device with improved reliability may be implemented by protecting configurations disposed on the substrate SUB in case that a process of providing the mother substrate (or the mother glass) in the individual display panel DP unit through a dry etching method by disposing the dummy unit DMP along the edge portion of the substrate SUB.

For example, according to an embodiment of the disclosure, a display device that minimizes the dead space of the non-display area NDA may be formed.

Although the present disclosure has been described with reference to the embodiment above, those skilled in the art or those having a common knowledge in the art will understand that the disclosure may be variously modified and changed without departing from the spirit and technical area of the disclosure described in the claims which will be described below.

Therefore, the technical scope of the disclosure should not be limited to the contents described in the detailed description of the specification, but should be defined by the claims.

The invention claimed is:

1. A display device comprising:
a substrate including a display area and a non-display area, the substrate including a first surface, a second surface opposing the first surface, and a side surface connecting the first surface and the second surface;
a pixel circuit layer disposed on the first surface of the substrate and including at least one transistor;
a display element layer disposed on the pixel circuit layer and including a light emitting element;
a thin film encapsulation layer disposed on the display element layer; and
a dummy unit disposed in the non-display area and disposed on an edge portion of the first surface of the substrate, the dummy unit including a transparent conductive material, wherein
the dummy unit protrudes from the edge portion in a direction parallel to the first surface of the substrate and in a direction away from the substrate and display element layer.

2. The display device according to claim 1, wherein the dummy unit comprises:
a first dummy part disposed on the first surface of the substrate; and
a second dummy part disposed on the first dummy part.

3. The display device according to claim 2, wherein the first dummy part is an etch stopper.

4. The display device according to claim 2, wherein the pixel circuit layer includes:
a buffer layer disposed on the substrate;
at least one insulating layer disposed on the buffer layer; and
the at least one transistor disposed on the buffer layer, and
the second dummy part covers the buffer layer or the at least one insulating layer.

5. The display device according to claim 2, wherein the first dummy part and the second dummy part overlap each other in a plan view.

6. The display device according to claim 2, wherein the first dummy part and the second dummy part extend along the edge portion of the first surface of the substrate.

7. The display device according to claim 6, wherein the second dummy part is closer to the display area from the edge portion of the first surface of the substrate than the first dummy part.

8. The display device according to claim 6, wherein the first dummy part and the second dummy part have a substantially same width.

9. The display device according to claim 2, further comprising:

at least one dam unit disposed in the non-display area of the substrate, wherein the at least one dam unit is between the display area and the first and second dummy parts.

10. The display device according to claim 2, wherein the thin film encapsulation layer comprises:

a first encapsulation layer disposed on the display element layer;

a second encapsulation layer disposed on the first encapsulation layer; and a third encapsulation layer disposed on the second encapsulation layer, the second encapsulation layer is an organic insulating layer, and the first and third encapsulation layers are inorganic insulating layers.

11. The display device according to claim 10, wherein the third encapsulation layer covers at least a portion of the second dummy part.

12. The display device according to claim 2, wherein the light emitting element comprises:

a first electrode electrically connected to the at least one transistor;

an emission layer disposed on the first electrode; and a second electrode disposed on the emission layer, and the second dummy part and the second electrode are disposed on a same layer and include a same material.

13. The display device according to claim 2, wherein the light emitting element comprises:

a first semiconductor layer doped with a first conductive dopant;

a second semiconductor layer doped with a second conductive dopant; and an active layer disposed between the first semiconductor layer and the second semiconductor layer.

14. The display device according to claim 2, further comprising:

a touch sensor disposed on the thin film encapsulation layer, wherein the touch sensor comprises:

a base layer disposed on the display element layer;

a first conductive part disposed on the base layer;

a first touch insulating layer disposed on the first conductive part;

a second conductive part disposed on the first touch insulating layer; and a second touch insulating layer disposed on the second conductive part, wherein the base layer is disposed on the second dummy part to cover the second dummy part.

15. The display device according to claim 2, wherein the first dummy part and the second dummy part protrude from the edge portion of the first surface of the substrate in the direction parallel to the first surface of the substrate and in a direction away from the substrate and display element layer.

16. The display device according to claim 2, wherein at least a portion of the first dummy part and the second dummy part contact each other.

17. The display device according to claim 2, wherein the side surface is inclined with respect to the first and second surfaces such that a width of the substrate decreases from the first surface to the second surface.

18. A display device comprising:

a substrate including a display area and a non-display area;

a pixel circuit layer disposed on a first surface of the substrate and including at least one transistor;

a display element layer disposed on the pixel circuit layer and including a light emitting element;

a thin film encapsulation layer disposed on the display element layer;

a dummy unit disposed in the non-display area and disposed on an edge portion of the substrate, the dummy unit including a transparent conductive material; and at least one dam unit disposed in the non-display area of the substrate, wherein the dummy unit comprises:

a first dummy part disposed on the first surface of the substrate; and a second dummy part disposed on the first dummy part, the at least one dam unit is between the display area and the first and second dummy parts, and a light blocking layer is disposed between the first dummy part and the second dummy part in the non-display area.

19. The display device according to claim 18, wherein the light blocking layer covers the at least one dam unit.

20. The display device according to claim 18, further comprising:

an auxiliary layer disposed between the light blocking layer and the second dummy part.

21. The display device according to claim 20, wherein the second dummy part covers the auxiliary layer.

22. The display device according to claim 20, wherein the auxiliary layer is a light diffusion layer including a scattering particle.

23. A method of manufacturing a display device, the method comprising:

preparing a substrate having two or more unit areas;

forming a first dummy part at an edge portion of the unit areas;

forming a pixel unit in each of the unit areas and forming a second dummy part overlapping the first dummy part;

forming a thin film encapsulation layer on the pixel unit and the second dummy part; and removing a portion of the substrate by performing a dry etching process to form a display panel unit.

24. The method according to claim 23, wherein the first dummy part and the second dummy part overlap each other and include a transparent conductive oxide.

* * * * *